(12) United States Patent
Rahmani et al.

(10) Patent No.: US 12,394,731 B2
(45) Date of Patent: Aug. 19, 2025

(54) COMPRESSION STRUCTURES FOR IC PACKAGES

(71) Applicant: Apple Inc., Cupertino, CA (US)

(72) Inventors: Helia Rahmani, Mountain View, CA (US); Stephane J. Marcadet, San Mateo, CA (US); Scott J. Campbell, Sunnyvale, CA (US); Zhiyong C. Xia, San Jose, CA (US); Stephen V. Jayanathan, Seattle, WA (US); Vineet Negi, Sunnyvale, CA (US); Christian Kettenbeil, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 510 days.

(21) Appl. No.: 17/951,978

(22) Filed: Sep. 23, 2022

(65) Prior Publication Data

US 2024/0105639 A1 Mar. 28, 2024

(51) Int. Cl.
*H05K 1/02* (2006.01)
*H01L 23/00* (2006.01)
*H01L 23/053* (2006.01)
*H05K 1/18* (2006.01)
*H05K 5/00* (2006.01)
*H05K 5/10* (2025.01)

(52) U.S. Cl.
CPC .......... *H01L 23/562* (2013.01); *H01L 23/053* (2013.01); *H05K 1/181* (2013.01); *H05K 5/0091* (2013.01); *H05K 5/10* (2025.01); *H05K 2201/10378* (2013.01); *H05K 2201/10393* (2013.01); *H05K 2201/10409* (2013.01); *H05K 2201/10598* (2013.01); *H05K 2201/10734* (2013.01)

(58) Field of Classification Search
CPC ....... H05K 1/0271; H05K 2201/10378; H05K 7/142
See application file for complete search history.

(56) References Cited

U.S. PATENT DOCUMENTS

| | | | | |
|---|---|---|---|---|
| 6,724,081 | B2 * | 4/2004 | Ho | H01L 23/49816 257/737 |
| 7,280,360 | B2 * | 10/2007 | Malone | H01L 23/4006 257/E23.084 |
| 10,156,870 | B2 * | 12/2018 | Cooper | G06F 1/1658 |
| 2007/0230130 | A1 * | 10/2007 | Alcoe | H01L 23/3735 257/E23.09 |
| 2009/0059537 | A1 * | 3/2009 | MacQuarrie | H01L 23/3675 361/711 |
| 2014/0328024 | A1 * | 11/2014 | Mataya | H05K 7/20454 361/720 |

* cited by examiner

*Primary Examiner* — Sherman Ng
(74) *Attorney, Agent, or Firm* — Kilpatrick Townsend & Stockton LLP

(57) ABSTRACT

Structures, methods, and apparatus for protecting interconnections between components and boards in an electronic device from damage resulting from a physical shock. This damage can occur due to differential tensile forces being applied between the component and the board during a drop or other shock event. An example can reduce or prevent damage by providing differential compression forces between the component and board that can cancel differential tensile forces between the component and board during the shock event. Another example can reduce or prevent damage by reducing differential tensile forces between a component and board. Another example can secure a component to the board to directly reduce the differential force in order to prevent damage.

20 Claims, 18 Drawing Sheets

COMPRESSION STRUCTURES FOR IC PACKAGES

BACKGROUND

The number of types of electronic devices that are commercially available has increased tremendously the past few years and the rate of introduction of new devices shows no signs of abating. Devices, such as portable computing devices, tablet, laptop, netbook, desktop, and all-in-one computers, smart phones, wearable computing devices, storage devices, portable media players, navigation systems, monitors, power adapters, and others, have become ubiquitous.

The functionality of these devices has likewise greatly increased. This in turn has led to increased complexity inside of these electronic devices. This increase in complexity has been implemented using larger components, such as system-on-a-chip (SOC), system-in-package (SIP), and other types of components. These already large components have become relatively larger over time as well.

These large components can be connected to each other through traces on printed circuit boards, flexible circuit boards, or other appropriate substrates, which can be collectively referred to as boards. The components can be connected to a board by soldering, for example using through-hole, surface-mount, or solder-ball contacts, during the manufacturing and assembly of the electronic device.

These electronic devices can experience physical shocks. For example, an electronic device can be dropped, the electronic device can be moved such that it strikes a surface, or an object can be dropped on the electronic device. These and other events can damage the solder connections between components and boards. These damaged solder connections can reduce the functionality of the electronic device or even render the electronic device inoperable.

Thus, what is needed are structures, methods, and apparatus for protecting interconnections between components and boards in an electronic device from damage resulting from a physical shock. To conserve resources, it can be desirable that these structures, methods, and apparatus can be readily manufactured.

SUMMARY

Accordingly, embodiments of the present invention can provide structures, methods, and apparatus for protecting interconnections between components and boards in an electronic device from damage resulting from a physical shock. These structures, methods, and apparatus can also be readily manufactured. Damage from a physical shock can occur due to a differential force being applied to a component relative to a board, to the component relative to another component, to the board relative to another board, or between one or more of these and other structures.

Embodiments of the present invention can prevent this damage in at least three ways. First, embodiments of the present invention can reduce or prevent damage by dissipating or cancelling damaging differential tensile forces on interconnect caused by a shock event. That is, energy from a shock event can be dampened, absorbed, or dissipated. For example, an illustrative embodiment of the present invention can provide one or more compressible supports that can provide mechanical support for a board and a component relative to a housing portion of an electronic device. The compressible support can be pre-biased or pre-compressed to provide a differential compression force between the component and the board. The differential compression force can cancel or reduce a differential tensile force caused by a shock event that can otherwise damage interconnections, such as solder-ball or other contacts on the component. In this way, energy from a shock event can be dissipated or absorbed by the compressible supports to prevent damage to interconnections and other structures. These compressible supports can be positioned between either or both the board or the component and a housing portion.

Second, embodiments of the present invention can reduce or prevent damage by reducing differential tensile forces between a component and board on which the component is mounted. That is, resulting differential tensile forces from a shock event can be dampened, absorbed, or dissipated. An illustrative embodiment of the present invention can provide compressible supports between the component and board. For example, compressible supports can be positioned between a load-bearing structure fixed to the board and the component. The compressible support can be pre-biased or pre-compressed to provide a differential compression force between a component and the board. The differential compression force can cancel or reduce a differential tensile force during a shock event that can otherwise damage interconnections, such as solder-ball contacts or other contacts on the component. In this way, energy from a shock event can be dissipated or absorbed by the compressible supports to prevent damage to interconnections and other structures.

Third, embodiments of the present invention can secure a component to the board to reduce differential forces in order to prevent damage. These and other embodiments of the present invention can provide a securing structure to secure or fix a component to a board such that both experience the same physical shock, thereby reducing resulting differential forces.

These and other embodiments of the present invention can provide an electronic device having a component mounted to a board. The component can be physically coupled or otherwise connected to a housing portion of the electronic device through a compressible support. The compressible support can provide mechanical support and can cancel or reduce damaging forces caused by a physical shock experienced by the electronic device.

The component can be physically coupled or otherwise connected to a housing portion of the electronic device through a compressible support in various ways. For example, the component can be mounted on a first side of the board, and one or more compressible supports can be positioned between the component and a first housing portion. The compressible supports can be positioned between a second side of the board and a second housing portion, where the second side is opposite the first side. The compressible supports can be between the component and the first housing portion and between the second side of the board and the second housing portion. The first housing portion and the second housing portion can be part of the same housing portion or parts of different housing portions.

These and other embodiments of the present invention can provide an electronic device having a component mounted to a board. The component can be physically coupled or otherwise connected back to the board through a compressible support. The compressible support can reduce a differential force between the component and the board. The compressible support can be positioned between the component and a loading structure attached to the board.

These and other embodiments of the present invention can provide an electronic device having a component mounted to a board. The component can be fixed or secured to the board through a securing structure. The securing structure can reduce a differential force between the component and the board.

These and other embodiments of the present invention can provide additional structures to securely fix a component to a board. For example, adhesives, such as epoxy, can be used to fix an edge or connector of a component to a board. These adhesives can form what can be referred to as an edge bond. These edge bonds can be used in conjunction with one or more of the various structures, methods, and apparatus shown here or otherwise provided by embodiments of the present invention.

In these examples, the compressible supports can be pliant, compliant, pliable, flexible, or otherwise able to compress or change shape under force. The compressible supports can be formed of foam, such as open-cell foam, semi-open-cell foam, semi-closed-cell foam, closed-cell foam, or other types of foam. The compressible supports can be formed of polyurethane, silicone, rubber, polycarbonate, or other polymer or elastomer. The compressible supports can be pre-compressed to improve shock absorption. The compressible supports can be formed of a compressed foam or elastomer. The compressible supports can be formed of conductive foam for electrical shielding. One or more surfaces of the compressible supports can be attached to components, boards, housing portions, and other structures using adhesives, solder, fasteners, or other material. A compressible support can be formed using a spring or other compressible structure, where the spring can be implemented using a Belleville washer, coned-disc spring, conical spring washer, disc spring, cupped spring washer, or other such apparatus. A compressible support can be a dashpot or other damper, such as a linear damper or rotary damper. The compressible supports can be formed using a combination of one or more of these components. The compressible supports can be formed using one or more of these and one or more other pliant, compliant, pliable, flexible, or otherwise compressible structures. The compressible supports can extend from a board or a component to a housing portion. A compressible support can be in series with another structure such as a pillar, where the pillar and the compressible support extend from a board or a component to a housing portion.

The compressible supports can absorb, dampen, and dissipate energy from a shock event, such as a drop. In these and other embodiments of the present invention, the compressible supports can be formed of a low-density foam having a high strain-rate sensitivity. The compressible supports can be pre-compressed during assembly to provide a differential compression force pushing the substrate towards the board. While the presence of a differential compression force is unlikely to damage solder-ball contacts under normal conditions, a differential compression force could damage or distort a housing portion or other portion of an electronic device. Using a foam or other material having a high strain-rate sensitivity can allow the compressible supports to provide a low differential compression force under normal or static conditions and a higher differential compression force under a shock event. The lower differential compression force under normal conditions can prevent damage or distortion to the housing portion. The higher differential compression force during a shock event can cancel a higher differential tensile force, which can help to protect the electronic device.

An edge bond can help to fix edges of the substrate in place relative to the board. This can help to convert differential forces into common-mode forces that are typically not damaging. That is, a force acting on the board is translated to the substrate, and a force acting on the substrate is translated to the board since they are fixed together. The combination of compressible supports along with the edge bond can reduce a differential tensile force between the board and the substrate, thereby protecting solder-ball contacts and other structures of the electronic device.

The compressible supports can have various cross-sections. That is, the compressible supports can have various footprints where contact with a component, board, or housing portion is made. For example, the compressible supports can have a square footprint, a rectangular footprint, a circular footprint, an "L" shaped footprint, a "U" shaped footprint, or other footprint. In these and other embodiments of the present invention, one, two, three, four, or more than four compressible supports can be included. For example, a single compressible support can encircle a chip of a component. The single compressible support can have a rectangular, circular, or other shaped footprint, with an opening for the chip.

In these examples, securing structures can be spring fingers or other structures, where the spring fingers can attach to a board and include a bend that enables the spring finger to apply a force on the component in the direction of the board. One, two, three, four, or more than four spring fingers can be used to secure a component to a board. For example, spring fingers can be positioned at each corner of a component. The spring fingers can include joining portions that can join two or more spring fingers into a single securing structure. The spring fingers can be formed of a nonconductive material. The spring fingers can be formed of a conductive material. The spring fingers can also serve to help dissipate heat.

In these examples, the electronic device can be a portable computing device, tablet, laptop, netbook, desktop, all-in-one computer, smart phone, wearable computing device, storage device, portable media player, navigation system, monitor, power adapter, remote, or other electronic device. The component can be a system-on-a-chip, a system-in-package, or other type of module or component. The board can support a number of components. The board can be a printed circuit board, a flexible circuit board, or other appropriate substrate. The board can be implemented using a number of traces printed on a structure of the electronic device, such as a portion of an enclosure. The housing portions can be an enclosure or portion of an enclosure, an internal support for the enclosure or other portion of the electronic device, a housing supporting the enclosure, a housing for a module, such as a thermal module, in the electronic device, or other enclosure or housing portion. The housing portion can be a lid or other structure covering the component. Where the housing portion is a lid that can be opened or is removable, compressible supports might be fixed to only one of a substrate and housing portion, for example using an adhesive, solder, fasteners, or other material or technique. The adhesive can be epoxy, a heat-activated film, pressure sensitive adhesive, or other type of adhesive.

In various embodiments of the present invention, the housings, housing portions, enclosures, loading structures, pillars, spring fingers, compressible supports, and other nonconductive and conductive portions can be formed using insert, injection, overmolding, or other molding, 3-D printing, machining, or other manufacturing process. They can be formed of silicon or silicone, rubber, hard rubber, plastic, nylon, glass-filled nylon, liquid-crystal polymers, or other nonconductive material or combination of materials. The printed circuit board or other appropriate substrates used can be formed of FR-4, BT or other material. Printed circuit boards can be replaced by other substrates, such as flexible circuit boards, in many embodiments of the present invention, while flexible circuit boards can be replaced by printed circuit boards in these and other embodiments of the present invention.

Various embodiments of the present invention can incorporate one or more of these and the other features described herein. A better understanding of the nature and advantages of the present invention can be gained by reference to the following detailed description and the accompanying drawings. Items referred to by the same reference number in different figures can refer to the same or similar items.

DESCRIPTION OF EXEMPLARY EMBODIMENTS

Figure 1:
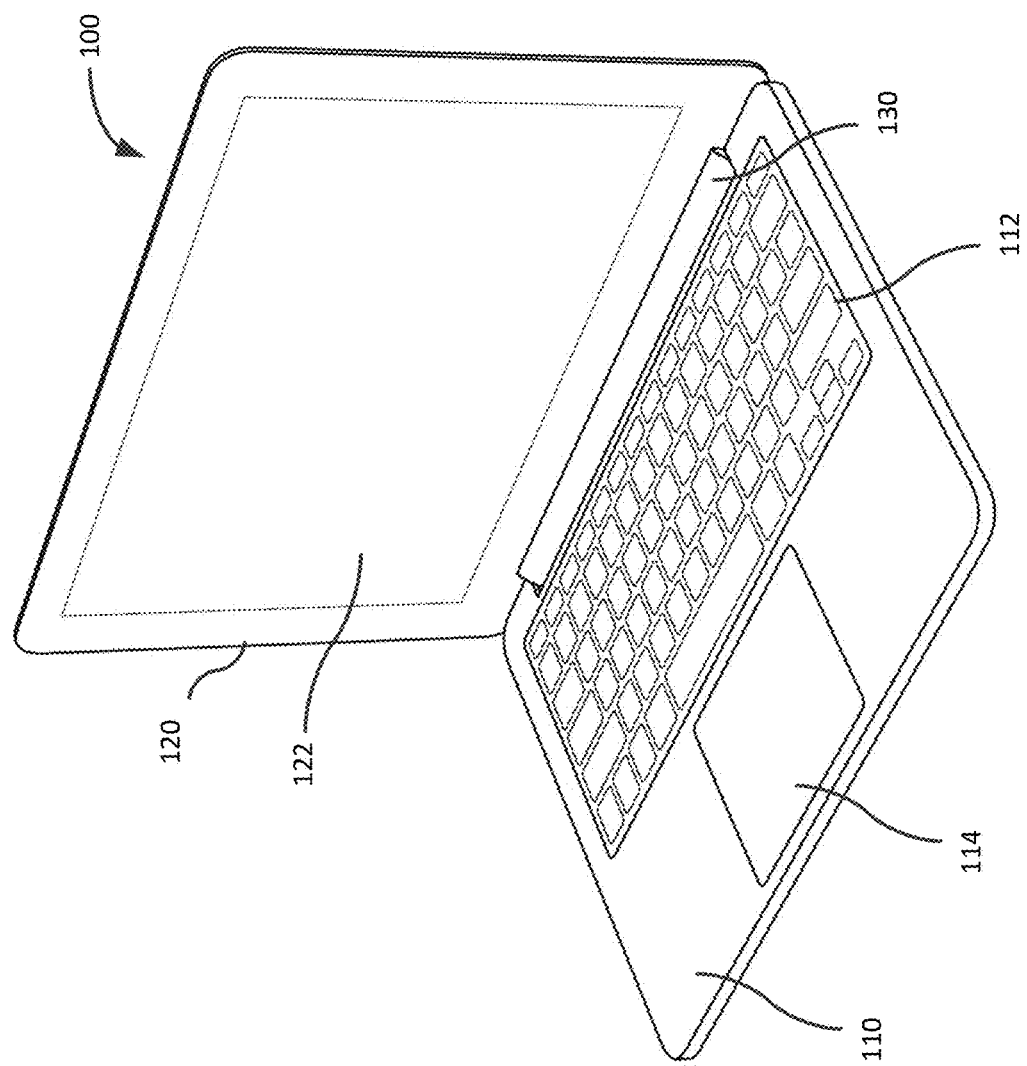
FIG. 1 illustrates an electronic system that can be improved by the incorporation of embodiments of the present invention.

FIG. 1 illustrates an electronic system that can be improved by the incorporation of embodiments of the present invention. This figure, as with the other included figures, is shown for illustrative purposes and does not limit either the possible embodiments of the present invention or the claims.

Electronic device 100 is shown in this example as a portable computing device having a base 110 supporting a keyboard 112 and track pad 114, as well as a lid 120 having a screen 122. Hinge 130 can connect the lid 120 to the base 110. Electronic device 100 can be another type of electronic device in these and other embodiments of the present invention, such as a portable computing device, tablet, laptop, netbook, desktop, all-in-one computer, smart phone, wearable computing device, storage device, portable media player, navigation system, monitor, power adapter, remote, or other electronic device.

Electronic device 100 can include one or more boards, such as printed circuit board 220 (shown in FIG. 2), flexible circuit boards, or other appropriate substrates. These boards can support one or more components 240 (shown in FIG. 2) that can be attached to board 220. The components 240 can be attached to board 220 using through-hole contacts, surface-mount contacts, solder-ball contacts 232 (shown in FIG. 2), or other types of contacts. These solder-ball contacts 232 can form electrical connects between board 220 and component 240.

On occasion, electronic device 100 can be dropped, electronic device 100 can be moved such that it strikes a surface, something can be dropped on electronic device 100, or electronic device 100 can experience a physical shock in some other way. These shock events can damage electronic device 100. For example, one or more of the though-hole contacts, surface-mount contacts, solder-ball contacts (232), or other types of contacts used to connect component 240 to board 220 can be cracked or damage. More specifically, the presence of a differential force between component 240 and board 220 can cause partial or complete disconnects of one or more electrical connections between component 240 and board 220.

Accordingly, these and other embodiments of the present invention can provide structures, methods, and apparatus that can prevent or limit damaging differential forces between component 240 and board 220 when electronic device 100 experiences a physical shock.

Figure 2:
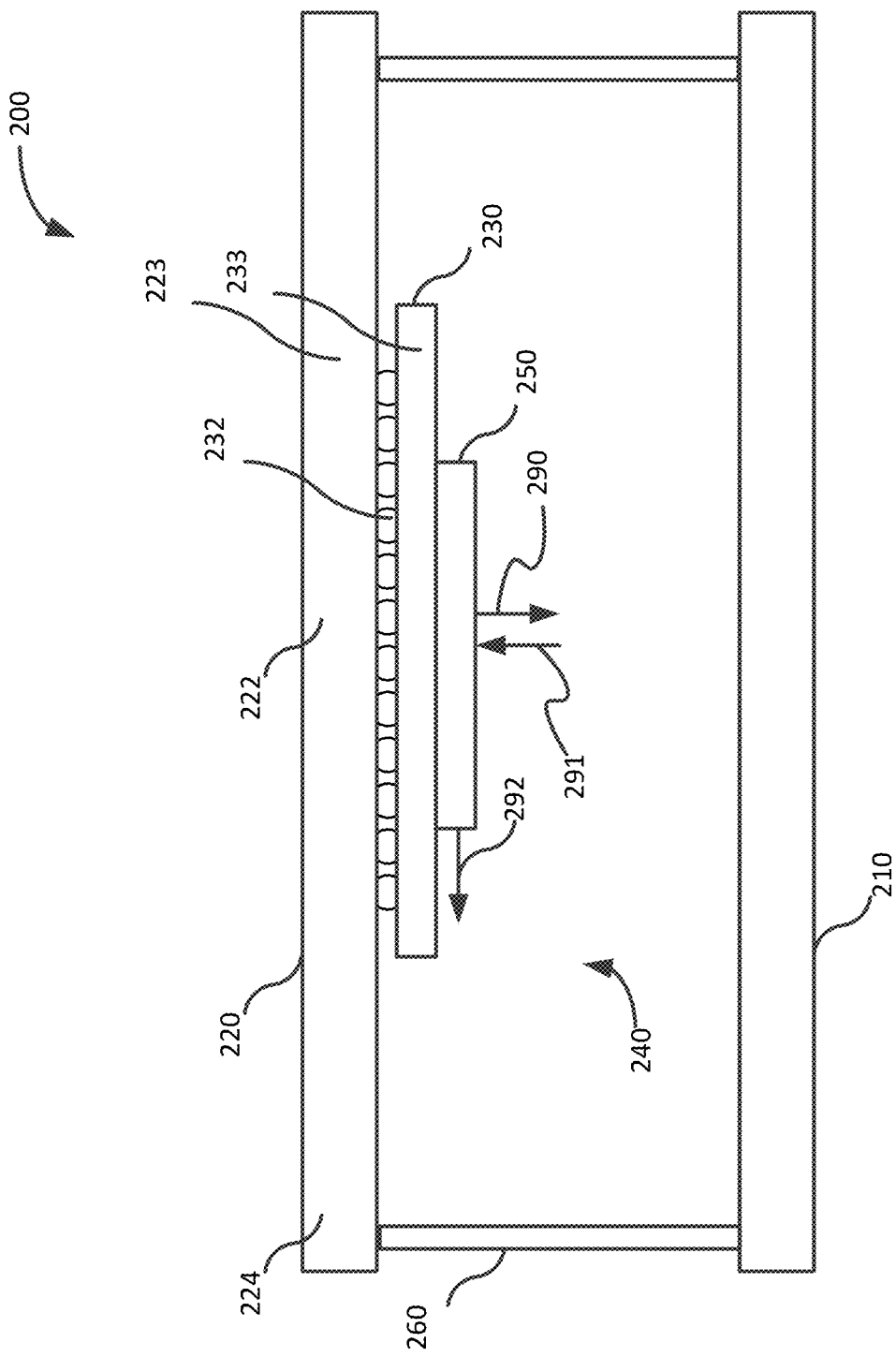
FIG. 2 illustrates a portion of an electronic device that can be improved by the incorporation of embodiments of the present invention.

FIG. 2 illustrates a portion of an electronic device that can be improved by the incorporation of embodiments of the present invention. Electronic device portion 200 can include board 220 supporting component 240. Component 240 can include substrate 230 and integrated circuit or chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230. Board 220 can be secured in place in electronic device 100 (shown in FIG. 1) through rigid supports 260, which can connect to housing portion 210. Housing portion 210 can be an enclosure or portion of an enclosure, an internal support for the enclosure or other portion of electronic device 100, a housing supporting the enclosure, a housing for a module, such as a thermal module, in electronic device 100, or other enclosure. Housing portion 210 can be a lid or other structure covering chip 250.

Electronic device 100, including electronic device portion 200 or the other electronic device portions shown in these examples, can be dropped, can strike a surface, can have an item dropped on it, or can encounter a physical shock in some other way. In this example, this shock can translate into a differential tensile force 290 acting in a downward direction as drawn, though shocks can generate forces in other directions. Differential tensile force 290 can cause a bowing in board 220, where a region 222 of board 220 is pushed lower (as drawn) than the supported region 224 of board 220. This can generate a differential tensile force 290 between substrate 230 and board 220, for example between edge 233 of substrate 230 and region 223 of board 220. The differential tensile force 290 can be an expansion force that can pull substrate 230 away from board 220, which can damage solder-ball contacts 232 that are positioned near edges 233 of substrate 230. It should be noted that the differential forces acting between components such as substrate 230 and board 220 typically cause damage, while forces that are common to components such as board 220 and substrate 230, that is, common-mode forces, are not typically damaging outside of extreme conditions.

More specifically, physical shocks due to a drop can generate a differential expansion or differential tensile force 290 that can act to separate substrate 230 from board 220, a differential compression force 291 that can act to push substrate 230 towards board 220, and a differential shear force 292 that can act to move substrate 230 laterally relative to board 220. The differential tensile force 290 can be particularly damaging as this force acts to pull substrate 230 away from board 220, an action that can crack or damage solder-ball contacts 232. In particular, solder-ball contacts 232 that are positioned near edges 233 of substrate 230 can be vulnerable since there are fewer surrounding solder-ball contacts 232 among which the shock can be distributed. The differential compression force 291 can be less damaging since this force acts to push substrate 230 towards board 220. While this force can cause damage, it can typically take a much higher differential compression force 291 to cause the same damage as differential tensile force 290. The differential shear force 292 can be more damaging than differential compression force 291 since it acts to shear substrate 230 along board 220. While differential shear force 292 is shown in acting in a particular direction, differential shear force 292 can act in any lateral direction.

During a physical shock event, such as a drop, compression forces can cancel tensile forces, and any net tensile or compression force that is not cancelled can be differential tensile force 290 or differential compression force 291. Since a net differential compression force 291 is less likely to cause damage, embodiments of the present invention can pre-apply an amount of differential compression force 291 between components such as substrate 230 and board 220. In the event of shock event, tensile forces have to overcome this pre-applied differential compression force 291 to cause damage. That is, a differential tensile force 290 that can occur during a drop can be reduced by the amount of pre-applied differential compression force 291. Accordingly, embodiments of the present invention can provide compressible supports that are pre-compressed to provide a differential compression force 291 that can reduce a differential tensile force 290 that can result from a physical shock. Examples are shown in the following figures.

Figure 3:
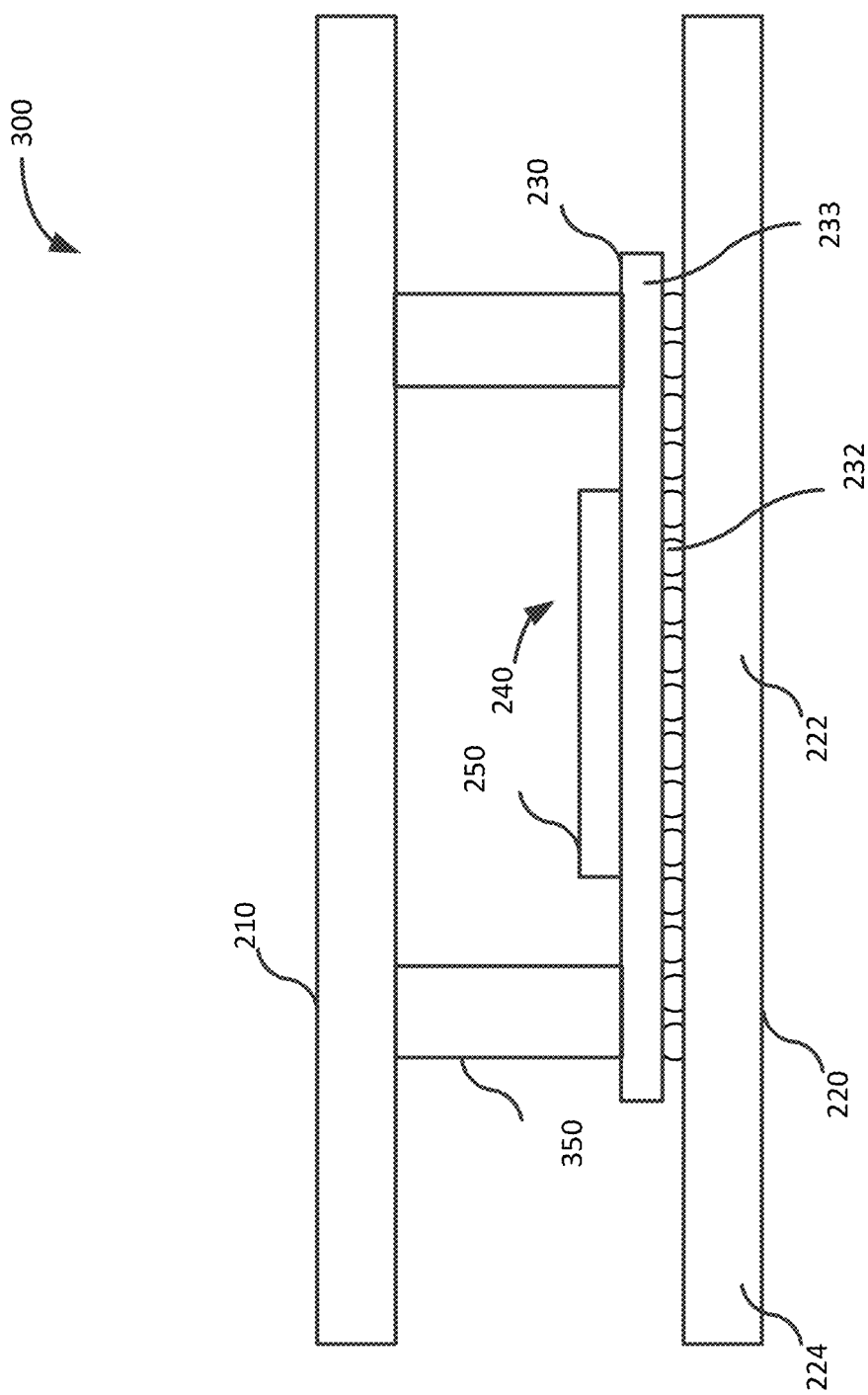
FIGS. 3-11 illustrate portions of electronic devices that include compressible supports between a component and a housing portion according to embodiments of the present invention.

FIG. 3 illustrates a portion of an electronic device that includes compressible supports between a component and a housing portion according to an embodiment of the present invention. Electronic device portion 300 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230. Board 220 can be supported in electronic device 100 (shown in FIG. 1) through rigid supports 260 (shown in FIG. 2), which can be placed at a distance away from compressible supports 350. Compressible supports 350 can be placed between substrate 230 of component 240 and housing portion 210. Compressible supports 350 can be fixed to either or both substrate 230 and housing portion 210, for example using an adhesive, solder, fasteners, or other material or technique.

Compressible supports 350 can be pliant, compliant, pliable, flexible, or otherwise able to compress or change shape under force. Compressible supports 350 can be formed of foam, such as open-cell foam, semi-open-cell foam, semi-closed-cell foam, closed-cell foam, or other types of foam. Compressible supports 350 can be formed of polyurethane, silicone, rubber, polycarbonate, or other polymer or elastomer. Compressible supports 350 can be pre-compressed to improve their ability to cancel damaging tensile forces. For example, compressible supports 350 can be formed of a compressed foam or elastomer. Compressible supports 350 can be formed of conductive foam for electrical shielding.

Compressible supports 350 can absorb, dampen, and dissipate energy from a shock event, such as a drop. Compressible supports 350 can flex, compress, and expand to allow movement of regions of board 220 to reduce the stress on solder-ball contacts 232. In these and other embodiments of the present invention, compressible supports 350 can be formed of a low-density foam having a high strain-rate sensitivity. Compressible supports 350 can be pre-compressed during assembly to provide a differential compression force 291 (shown in FIG. 2) pushing substrate 230 towards board 220. While the presence of a differential compression force 291 is unlikely to damage solder-ball contacts 232 under normal conditions, a differential compression force 291 could damage or distort housing portion 210 or other portion of electronic device 100. Using a foam or other material having a high strain-rate sensitivity can allow compressible supports 950 to provide a low differential compression force 291 under normal or static conditions and a higher differential compression force 291 under a shock event. The lower differential compression force under normal conditions can prevent damage or distortion to housing portion 210. The higher differential compression force 291 during a shock event can cancel a higher differential tensile force 290 (shown in FIG. 2), which can help to protect electronic device 100.

Additionally, compressible supports 350 can compress and expand when electronic device portion 300 experiences a physical shock. Specifically, since region 224 of board 220 can move relative to housing portion 210 during a shock, the vertical displacement between region 222 and region 224 of board 220 can be reduced as compared to when fixed or rigid supports 260 (shown in FIG. 2) are used near region 224. This can reduce a differential tensile force at edges 233 of substrate 230 relative to board 220, thereby protecting solder-ball contacts 232 and other structures of electronic device portion 300. In these examples, it should be noted that rigid supports 260 can be included and are relatively remote from component 240 such that region 224 of board 220 can move relative to housing portion 210 during a shock.

When compressible supports 350 are formed of foam or similar material, they can have various profiles when seen from a top view as drawn. That is, compressible supports 350, compressible supports 560, compressible supports 950, compressible supports 1250, compressible supports 1810 and 1820, and the other compressible supports shown here and otherwise provided by embodiments of the present invention, can have various footprints where contact with substrate 230 or housing portion 210 (or another housing portion) is made. For example, compressible supports can have a square footprint, a rectangular footprint, a circular footprint, an "L" shaped footprint, a "U" shaped footprint, or other footprint. In these and other embodiments of the present invention, one, two, three, four, or more than four compressible supports 350 can be included. For example, a single compressible support 350 can encircle chip 250. The single compressible support can have a rectangular, circular, or other shaped footprint, with an opening for chip 250.

In this and the following examples, one or more compressible supports 350 can be formed using a spring or other compressible structure, where the spring can be implemented using a Belleville washer, coned-disc spring, conical spring washer, disc spring, cupped spring washer, or other such apparatus. Compressible support 350 can be a dashpot or other damper, such as a linear damper or rotary damper. Compressible supports 350 can be formed using a combination of one or more of these components. Compressible supports 350 can be formed using one or more of these and one or more other pliant, compliant, pliable, flexible, or otherwise compressible structures.

Component 240 can be a system-on-a-chip, a system-in-package, or other type of module or component. Board 220 can support a number of components 240. Board 220 can be a printed circuit board, a flexible circuit board, or other appropriate substrate. Board 220 can be implemented using a number of traces printed on a structure of the electronic device, such as a portion of an enclosure. Housing portion 210 can be an enclosure or portion of an enclosure, an internal support for the enclosure or other portion of electronic device 100, a housing supporting the enclosure, a housing for a module, such as a thermal module, in electronic device 100, or other enclosure. Housing portion 210 can be a lid or other structure covering component 240. Where housing portion 210 is a lid that can be opened or is removable, compressible supports 350 might be fixed to only one of substrate 230 and housing portion 210, for example using an adhesive, solder, fasteners, or other material or technique. The adhesive can be epoxy, a heat-activated film, pressure sensitive adhesive, or other type of adhesive.

Compressible supports 350, and the other compressible supports shown herein, such as compressible supports 560 (shown in FIG. 5), compressible supports 950 (shown in FIG. 9), compressible supports 1250 (shown in FIG. 12), and compressible supports 1810 and 1820 (shown in FIG. 18) (all referred to here as compressible supports 350 for simplicity) can be positioned between various structures other than housing portion 210 and component 240 in these and other embodiments of the present invention. For example, compressible supports 350 can be positioned between two or more of housing portion 210, component 240, a second board (not shown), a surface of a device or structure, such as a battery (not shown), keyboard 112, track pad 114 (both shown in FIG. 1), drive (not shown), ventilation path (not shown), heatsink (not shown), or other device or structure. Also, while compressible supports 350 can be between housing portion 210 and component 240, one or more other devices or structures can be between housing portion 210 and component 240 such that one or more compressible supports 350 extend from the one or more other devices or structures to either the housing portion 210 or component 240. In one example, a lid, heatsink, or other device or structure (not shown) can be attached to chip 250 using adhesives (not shown.) In this example, compressible supports 350 can be positioned between the lid, heatsink, or other device or structure and housing portion 210. In this scenario, the lid, heatsink, or other device or structure can be considered to be part of component 240.

These and other embodiments of the present invention can provide additional structures to securely fix a component to a board. For example, adhesives, such as epoxy, can be used to fix an edge of a component to a board. These adhesives can form what can be referred to as an edge bond. These edge bonds can be used in conjunction with one or more of the various structures, methods, and apparatus shown here or otherwise provided by embodiments of the present invention. An example is shown in the following figure.

Figure 4:
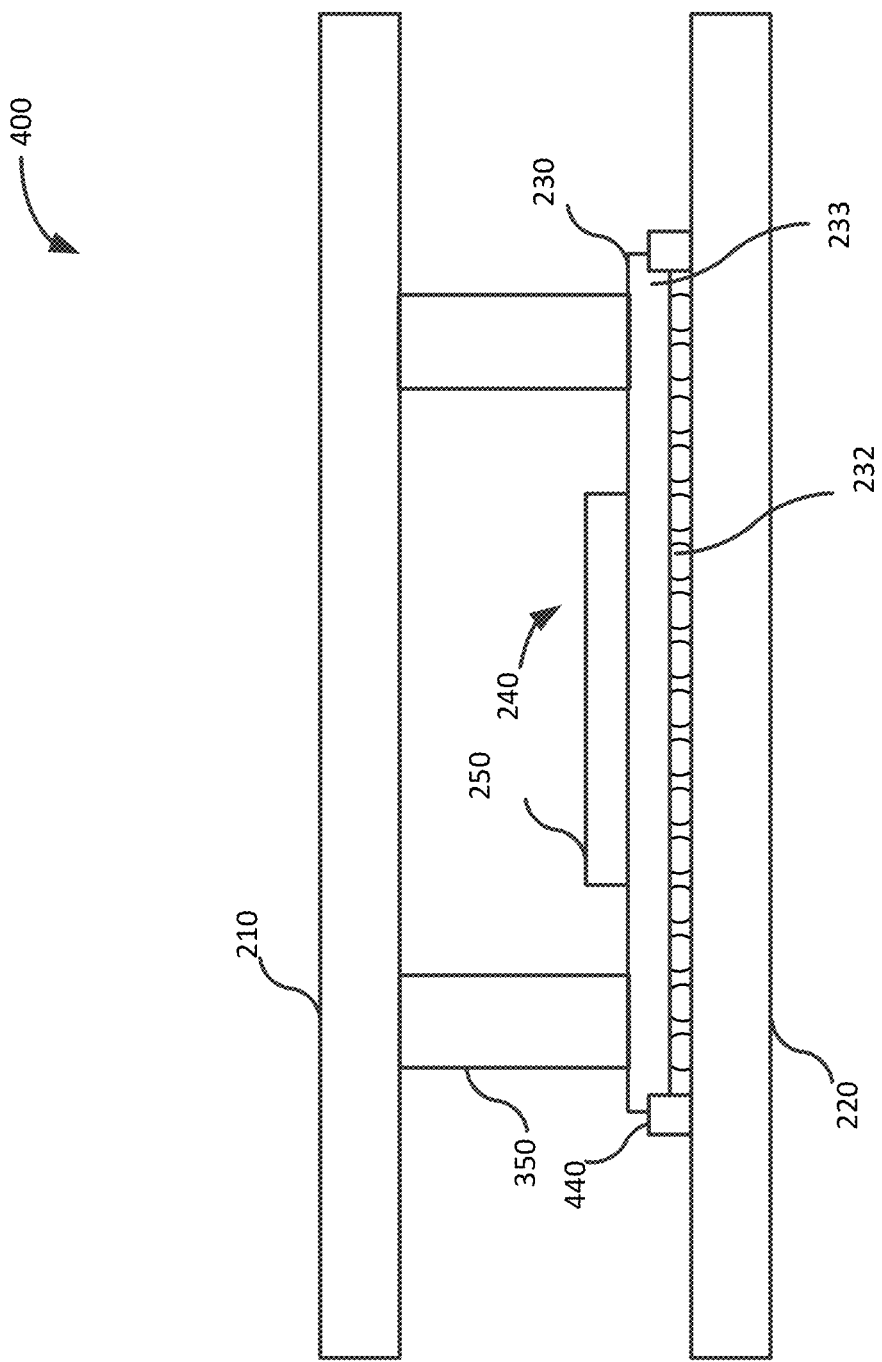

FIG. 4 illustrates a portion of an electronic device that includes compressible supports between a component and a housing portion according to an embodiment of the present invention. Electronic device portion 400 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230. Board 220 can be supported in electronic device 100 through rigid supports 260 (shown in FIG. 2), which can connect to housing portion 210 at a distance away from compressible supports 350. Compressible supports 350 can extend from substrate 230 to housing portion 210. Compressible supports 350 can be fixed to either or both substrate 230 and housing portion 210, for example using an adhesive, solder, fasteners, or other material or technique. Edge bonds 440 formed of epoxy or other material can be placed at one or more edges 233 of substrate 230 to join substrate 230 to board 220.

Edge bond 440 can help to fix edges 233 of substrate 230 in place relative to board 220. This can help to convert differential forces into common-mode forces that are typically not damaging. That is, a force acting on board 220 is translated to substrate 230, and a force acting on substrate 230 is translated to board 220 since they are fixed together. The combination of compressible supports 350 along with edge bond 440 can reduce a differential tensile force 290 (shown in FIG. 2) at edges 233 of substrate 230, thereby protecting solder-ball contacts 232 and other structures of electronic device portion 400.

Figure 5:
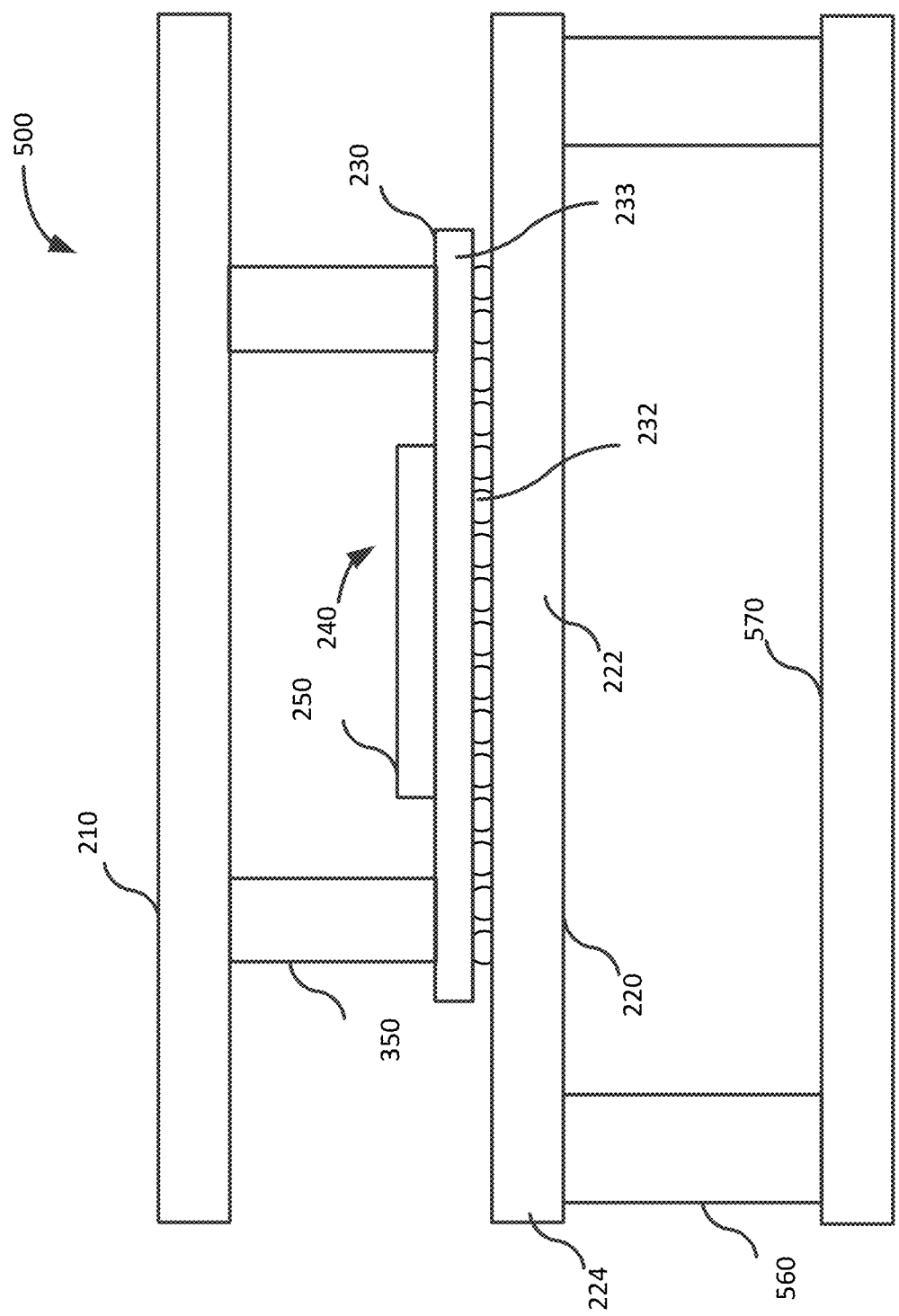

FIG. 5 illustrates a portion of an electronic device that includes compressible supports between a component and a housing portion according to an embodiment of the present invention. Electronic device portion 500 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230. Board 220 can be supported in electronic device 100 (shown in FIG. 1) through rigid supports 260 (shown in FIG. 2), which can connect to either or both housing portion 210 and housing portion 570 at a distance away from compressible supports 350 and compressible supports 560. Compressible supports 350 can be placed between substrate 230 and housing portion 210. Compressible supports 560 can be between board 220 and housing portion 570. Compressible supports 350 can be fixed to either or both substrate 230 and housing portion 210 and compressible supports 560 can be fixed to either or both board 220 and housing portion 570, for example using an adhesive, solder, fasteners, or other material or technique.

Housing portion 570 can be the same as or similar to housing portion 210. Housing portion 570 can be part of the same housing portion as housing portion 210. Compressible supports 560 can be the same as or similar to compressible supports 350 above. Compressible supports 560 can be pliant, compliant, pliable, flexible, or otherwise able to compress or change shape under force. Compressible supports 560 can be formed of foam, such as open-cell foam, semi-open-cell foam, semi-closed-cell foam, closed-cell foam, or other types of foam. Compressible supports 560 can be formed of polyurethane, silicone, rubber, polycarbonate, or other polymer or elastomer. Compressible supports 560 can be pre-compressed to improve their ability to cancel damaging tensile forces. For example, compressible supports 560 can be formed of a compressed foam or elastomer. Compressible supports 560 can be formed of conductive foam for electrical shielding.

Compressible supports 350 and 560 can absorb, dampen, and dissipate energy from a shock event, such as a drop. Compressible supports 350 and 560 can flex, compress, and expand to allow movement of regions of board 220 to reduce the stress on solder-ball contacts 232. In these and other embodiments of the present invention, compressible supports 350 and 560 can be formed of a low-density foam having a high strain-rate sensitivity. Compressible supports 350 and 560 can be pre-compressed during assembly to provide a differential compression force 291 (shown in FIG. 2) pushing substrate 230 towards board 220. While the presence of a differential compression force 291 is unlikely to damage solder-ball contacts 232 under normal conditions, a differential compression force 291 could damage or distort housing portion 210 or other portion of electronic device 100. Using a foam or other material having a high strain-rate sensitivity can allow compressible supports 350 and 560 to provide a low differential compression force 291 under normal or static conditions and a higher differential compression force 291 under a shock event. The lower differential compression force under normal conditions can prevent damage or distortion to housing portion 210. The higher differential compression force 291 during a shock event can cancel a higher differential tensile force 290 (shown in FIG. 2), which can help to protect electronic device 100. Also, either or both surfaces of housing portion 210 and housing portion 570 can be a surface that a user can interact with, such as keyboard 112, track pad 114 (both shown in FIG. 1), or other interactive surface. The use of a material that provides a high differential compression force 291 under normal circumstances could provide a stiffness to areas of housing portion 210 or housing portion 570 that could affect the user interaction in an undesirable manner. Accordingly, the use a high strain-rate sensitivity foam can help to provide a more desirable surface for interaction.

Additionally, compressible supports 350 and compressible supports 560 can compress and expand when electronic device portion 500 experiences a physical shock. Specifically, since region 224 of board 220 can move relative to housing portion 210 during a shock, the vertical displacement between region 222 and region 224 of board 220 can be reduced as compared to when fixed or rigid supports 260 (shown in FIG. 2) are used near region 224. This can reduce a differential tensile force at edges 233 of substrate 230 relative to board 220, thereby protecting solder-ball contacts 232 and other structures of electronic device portion 500. In these examples, it should be noted that rigid supports 260 can be included and are relatively remote from component 240 such that region 224 of board 220 can move relative to housing portion 210 during a shock.

When compressible supports 560 are formed of foam or similar material, they can have various profiles when seen from a top view as drawn. That is, compressible supports 350, and the other compressible supports shown here, can have various footprints where contact with board 220 or housing portion 570 (or another housing portion) is made. For example, compressible supports can have a square footprint, a rectangular footprint, a circular footprint, an "L" shaped footprint, a "U" shaped footprint, or other footprint. In these and other embodiments of the present invention, one, two, three, four, or more than four compressible supports 560 can be included.

In this and the other examples, one or more compressible supports 560 can be formed using a spring or other compressible structure, where the spring can be implemented using a Belleville washer, coned-disc spring, conical spring washer, disc spring, cupped spring washer, or other such apparatus. Compressible support 560 can be a dashpot or other damper, such as a linear damper or rotary damper. Compressible supports 350 can be formed using a combination of one or more of these components. Compressible supports 350 can be formed using one or more of these and one or more other pliant, compliant, pliable, flexible, or otherwise compressible structures.

Figure 6:
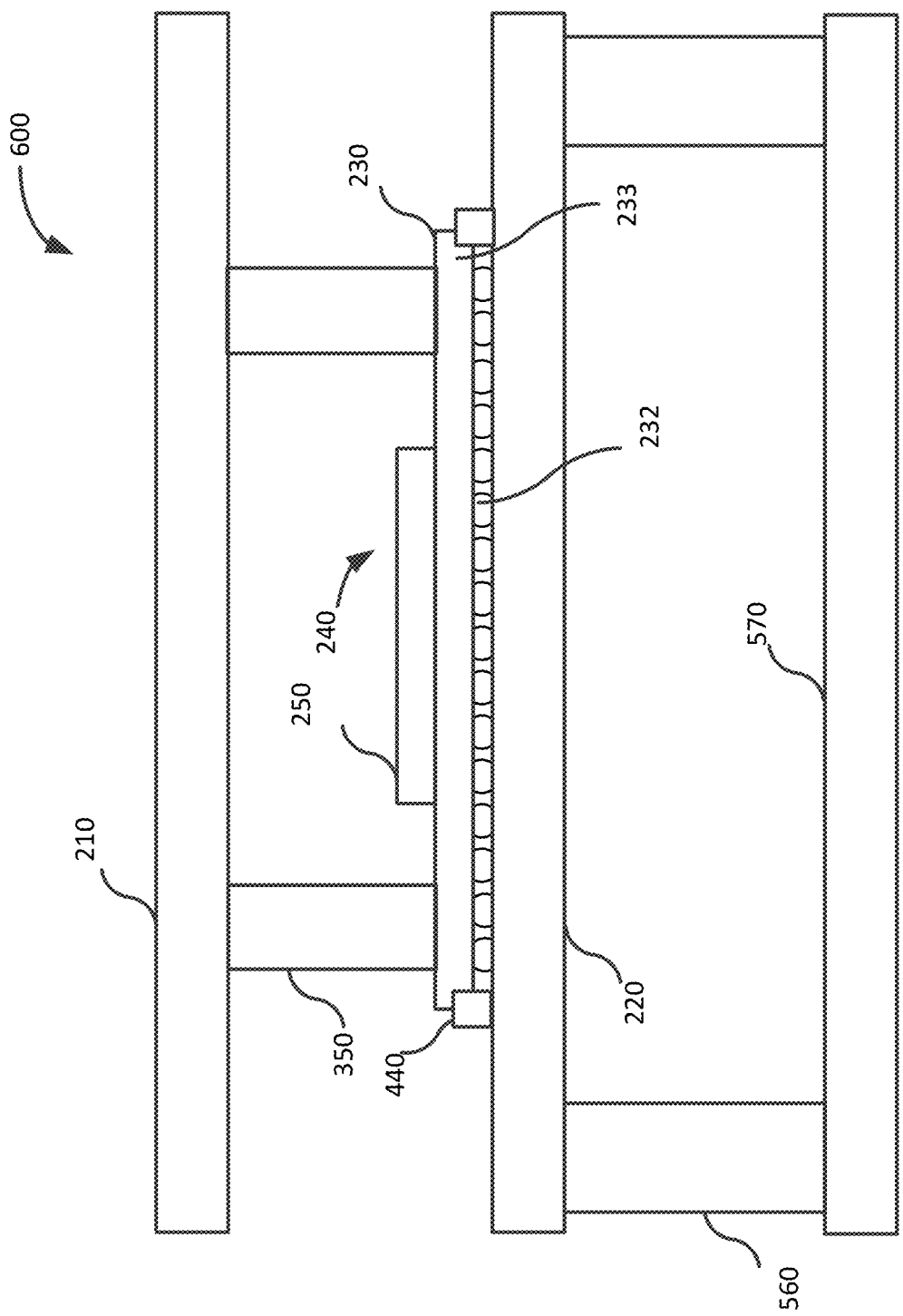

FIG. 6 illustrates a portion of an electronic device that includes compressible supports between a component and a first housing portion and a board and a second housing portion according to an embodiment of the present invention. Electronic device portion 600 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230. Board 220 can be supported in electronic device 100 through rigid supports 260 (shown in FIG. 2), which can connect to housing portion 210, housing portion 570, or both, at a distance away from compressible supports 350 and compressible supports 560. Compressible supports 350 can be between substrate 230 and housing portion 210 and compressible supports 560 can be between board 220 and housing portion 570. Compressible supports 350 can be fixed to either or both substrate 230 and housing portion 210 and compressible supports 560 can be fixed to either or both board 220 and housing portion 570, for example using an adhesive, solder, fasteners, or other material or technique. Edge bonds 440 formed of epoxy or other material can be placed at one or more edges 233 of substrate 230 to join substrate 230 to board 220.

Edge bond 440 can help to fix edges 233 of substrate 230 in place relative to board 220. This can help to convert differential forces into common-mode forces that are typically not damaging. That is, a force acting on board 220 is translated to substrate 230, and a force acting on substrate 230 is translated to board 220 since they are fixed together. The combination of compressible supports 350 along with edge bond 440 can reduce a differential tensile force 290 (shown in FIG. 2) at edges 233 of substrate 230, thereby protecting solder-ball contacts 232 and other structures of electronic device portion 600.

Figure 7:
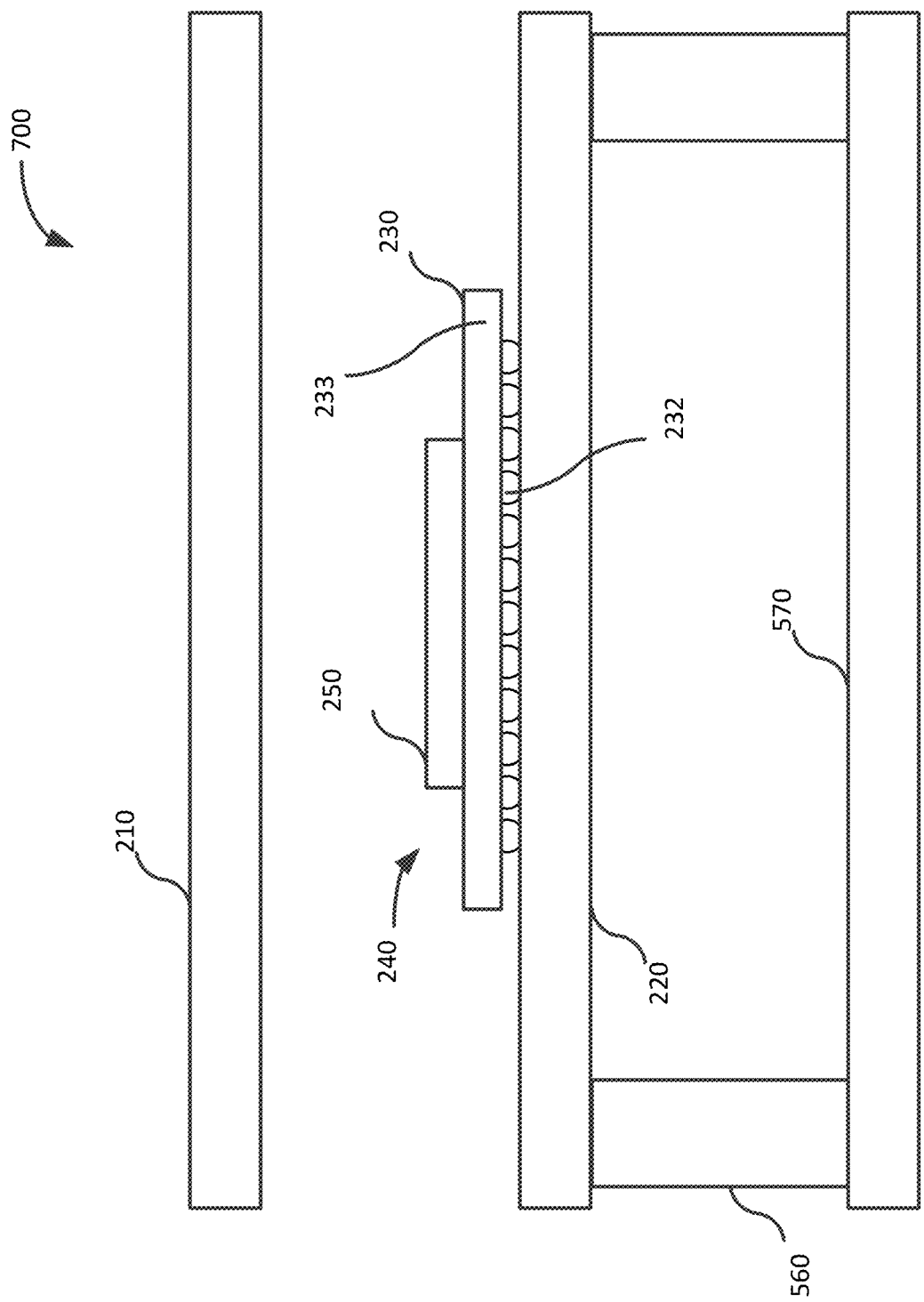

FIG. 7 illustrates a portion of an electronic device that includes compressible supports between a board and a housing portion according to an embodiment of the present invention. Electronic device portion 700 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230. Board 220 can be supported in electronic device 100 using rigid supports 260 (shown in FIG. 2), which can connect to either or both housing portion 210 and housing portion 570 at a distance away from compressible supports 560. Compressible supports 560 can be between board 220 and housing portion 570. Compressible supports 560 can be fixed to either or both board 220 and housing portion 570, for example using an adhesive, solder, fasteners, or other material or technique.

Edge bond 440 (shown in FIG. 4) can help to fix edges 233 of substrate 230 in place relative to board 220. This can help to convert differential forces into common-mode forces that are typically not damaging. That is, a force acting on board 220 is translated to substrate 230, and a force acting on substrate 230 is translated to board 220 since they are fixed together. The combination of compressible supports 350 along with edge bond 440 can reduce a differential tensile force 290 (shown in FIG. 2) at edges 233 of substrate 230, thereby protecting solder-ball contacts 232 and other structures of electronic device portion 700.

Figure 8:
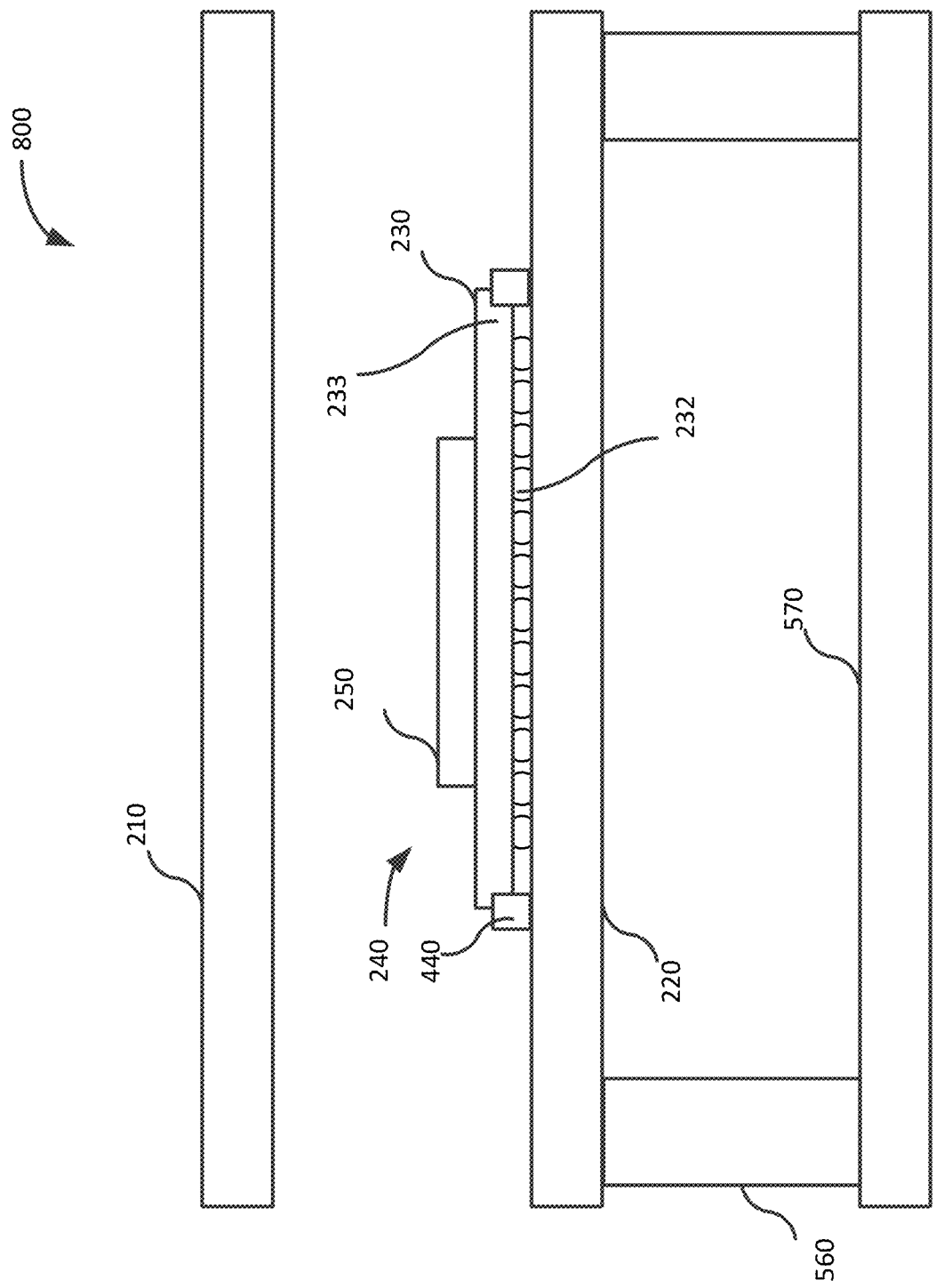

FIG. 8 illustrates a portion of an electronic device that includes compressible supports between a board and a housing portion according to an embodiment of the present invention. Electronic device portion 800 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230. Board 220 can be supported in electronic device 100 using rigid supports 260 (shown in FIG. 2) that can connect to either or both housing portion 210 and housing portion 570 at a distance away from compressible supports 560. Compressible supports 560 can be between board 220 and housing portion 570. Compressible supports 560 can be fixed to either or both board 220 and housing portion 570, for example using an adhesive, solder, fasteners, or other material or technique. Edge bonds 440 formed of epoxy or other material can be placed at one or more edges 233 of substrate 230 to join substrate 230 to board 220.

Edge bond 440 can help to fix edges 233 of substrate 230 in place relative to board 220. This can help to convert differential forces into common-mode forces that are typically not damaging. That is, a force acting on board 220 is translated to substrate 230, and a force acting on substrate 230 is translated to board 220 since they are fixed together. The combination of compressible supports 560 along with edge bond 440 can reduce a differential tensile force 290 (shown in FIG. 2) at edges 233 of substrate 230, thereby protecting solder-ball contacts 232 and other structures of electronic device portion 800.

In these and other embodiments of the present invention, a compressible support can be in series with another structure such as a pillar, where the pillar and the compressible support extend from a board or a component to a housing portion. An example is shown in the following figure.

Figure 9:
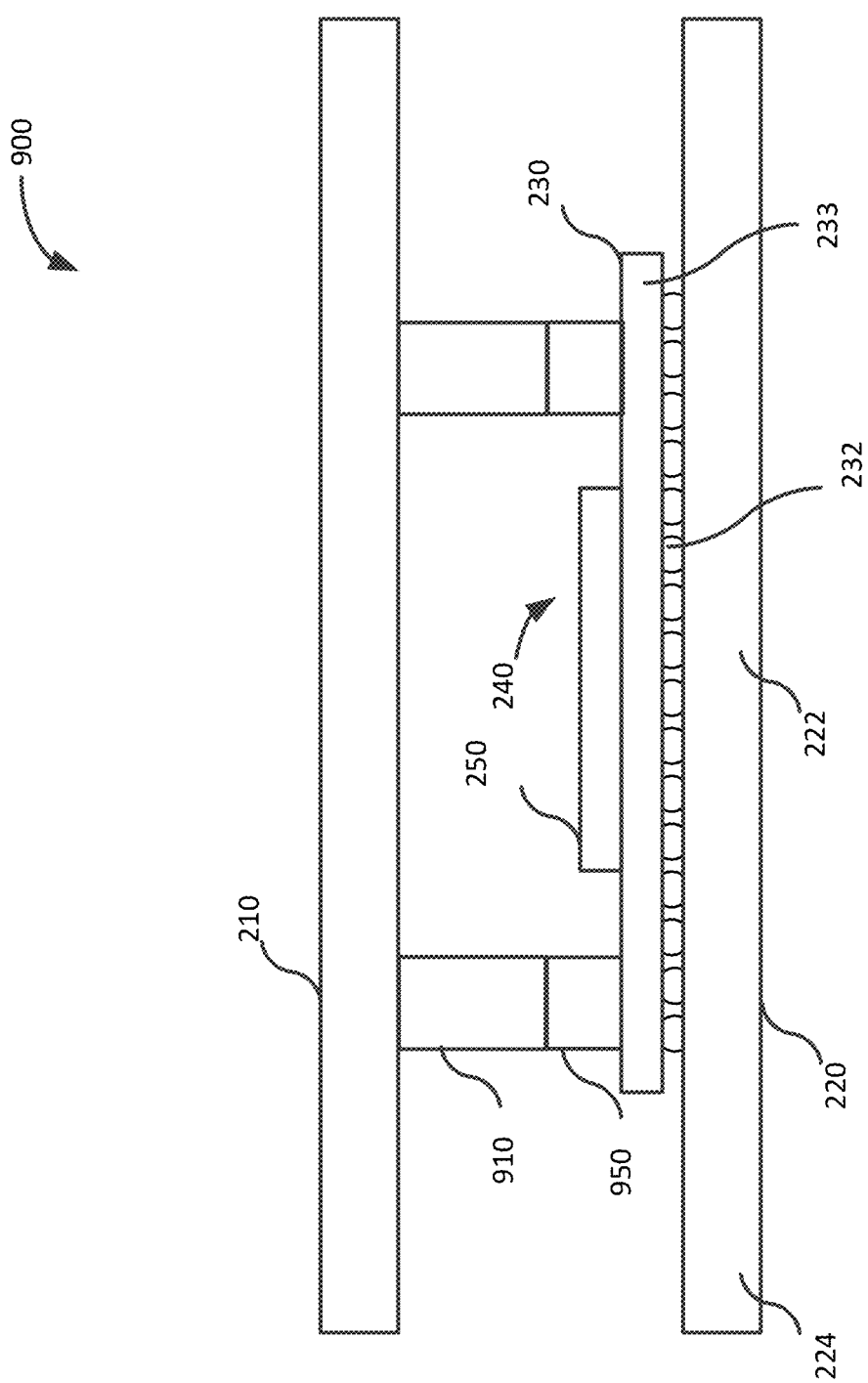

FIG. 9 illustrates a portion of an electronic device that includes compressible supports between a board and a housing portion according to an embodiment of the present invention. Electronic device portion 900 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230. Board 220 can be secured in place in electronic device 100 (shown in FIG. 1) using rigid supports 260 (shown in FIG. 2), which can connect to housing portion 210 at a distance away from compressible supports 950.

Compressible supports 950 can be between pillars 910 and substrate 230. Pillars 910 can be formed as part of housing portion 210, or pillars 910 can be separate from housing portion 210. Pillars 910 can be attached to substrate 230 and compressible supports 950 can be between pillars 910 and housing portion 210. Pillars 910 can have a cross-section or footprint that matches, mates with, or otherwise complements compressible supports 950. For example, pillars 910 and compressible supports 950 can encircle component 240. Pillars 910 can have a cross-section or footprint that differs from that of compressible supports 950. Compressible supports 350 and pillars 910 (when separate from housing portion 210) can be fixed to either or both board 220 and housing portion 210, for example using an adhesive, solder, fasteners, or other material or technique.

Compressible supports 950 can be the same as or similar to compressible supports 350 above. Compressible supports 950 can be pliant, compliant, pliable, flexible, or otherwise able to compress or change shape under force. Compressible supports 950 can be formed of foam, such as open-cell foam, semi-open-cell foam, semi-closed-cell foam, closed-cell foam, or other types of foam. Compressible supports 950 can be formed of polyurethane, silicone, rubber, polycarbonate, or other polymer or elastomer. Compressible supports 950 can be pre-compressed to improve their ability to cancel damaging tensile forces. For example, compressible supports 950 can be formed of a compressed foam or elastomer. Compressible supports 950 can be formed of conductive foam for electrical shielding.

Compressible supports 950 can absorb, dampen, and dissipate energy from a shock event, such as a drop. Compressible supports 950 can flex, compress, and expand to allow movement of regions of board 220 to reduce the stress on solder-ball contacts 232. In these and other embodiments of the present invention, compressible supports 950 can be formed of a low-density foam having a high strain-rate sensitivity. Compressible supports 950 can be pre-compressed during assembly to provide a differential compression force 291 (shown in FIG. 2) pushing substrate 230 towards board 220. While the presence of a differential compression force 291 is unlikely to damage solder-ball contacts 232 under normal conditions, a differential compression force 291 could damage or distort housing portion 210 or other portion of electronic device 100. Using a foam or other material having a high strain-rate sensitivity can allow compressible supports 950 to provide a low differential compression force 291 under normal or static conditions and a higher differential compression force 291 under a shock event. The lower differential compression force under normal conditions can prevent damage or distortion to housing portion 210. The higher differential compression force 291 during a shock event can cancel a higher differential tensile force 290 (shown in FIG. 2), which can help to protect electronic device 100.

Additionally, compressible supports 950 can compress and expand when electronic device portion 900 experiences a physical shock. Specifically, since region 224 of board 220 can move relative to housing portion 210 during a shock, the vertical displacement between region 222 and region 224 of board 220 can be reduced as compared to when fixed rigid supports 260 (shown in FIG. 2) are used near region 224. This can reduce a differential tensile force at edges 233 of substrate 230 relative to board 220, thereby protecting solder-ball contacts 232 and other structures of electronic device portion 900. In these examples, it should be noted that rigid supports 260 can be included and are relatively remote from component 240 such that region 224 of board 220 can move relative to housing portion 210 during a shock.

When compressible supports 950 are formed of foam or similar material, they can have various profiles when seen from a top view as drawn. That is, compressible supports 950, and the other compressible supports shown here, can have various footprints where contact with substrate 230 or pillar 910 is made. For example, compressible supports can have a square footprint, a rectangular footprint, a circular footprint, an "L" shaped footprint, a "U" shaped footprint, or other footprint. In these and other embodiments of the present invention, one, two, three, four, or more than four compressible supports 950 can be included. For example, a single compressible support 950 can encircle chip 250. The single compressible support can have a rectangular, circular, or other shaped footprint, with an opening for chip 250.

In this and the other examples, one or more compressible supports 950 can be formed using a spring or other compressible structure, where the spring can be implemented using a Belleville washer, coned-disc spring, conical spring washer, disc spring, cupped spring washer, or other such apparatus. Compressible support 950 can be a dashpot or other damper, such as a linear damper or rotary damper. Compressible supports 950 can be formed using a combination of one or more of these components. Compressible supports 950 can be formed using one or more of these and one or more other pliant, compliant, pliable, flexible, or otherwise compressible structures.

Housing portion 210 can be an enclosure or portion of an enclosure, an internal support for the enclosure or other portion of electronic device 100, a housing supporting the enclosure, a housing for a module, such as a thermal module, in electronic device 100, or other enclosure. Housing portion 210 can be a lid or other structure covering chip 250. Where housing portion 210 is a lid that can be opened or is removable, compressible supports 350 might be fixed to only one of substrate 230 and housing portion 210, for example using an adhesive, solder, fasteners, or other material or technique. The adhesive can be epoxy, a heat-activated film, pressure sensitive adhesive, or other type of adhesive.

In this example, a series of a pillar 910 and a compressible support 950 can be between substrate 230 and housing portion 210. This series of a pillar 910 and a compressible support 950 can be implemented in the examples shown above. Specifically, a series of a pillar 910 and a compressible support 950 can be used to implement compressible supports 950 or 560 in the examples shown in FIGS. 3-8.

Edge bond 440 (shown in FIG. 4) can help to fix edges 233 of substrate 230 in place relative to board 220. This can help to convert differential forces into common-mode forces that are typically not damaging. That is, a force acting on board 220 is translated to substrate 230, and a force acting on substrate 230 is translated to board 220 since they are fixed together. The combination of compressible supports 350 along with edge bond 440 can reduce a differential tensile force 290 (shown in FIG. 2) at edges 233 of substrate 230, thereby protecting solder-ball contacts 232 and other structures of electronic device portion 900.

Figure 10:
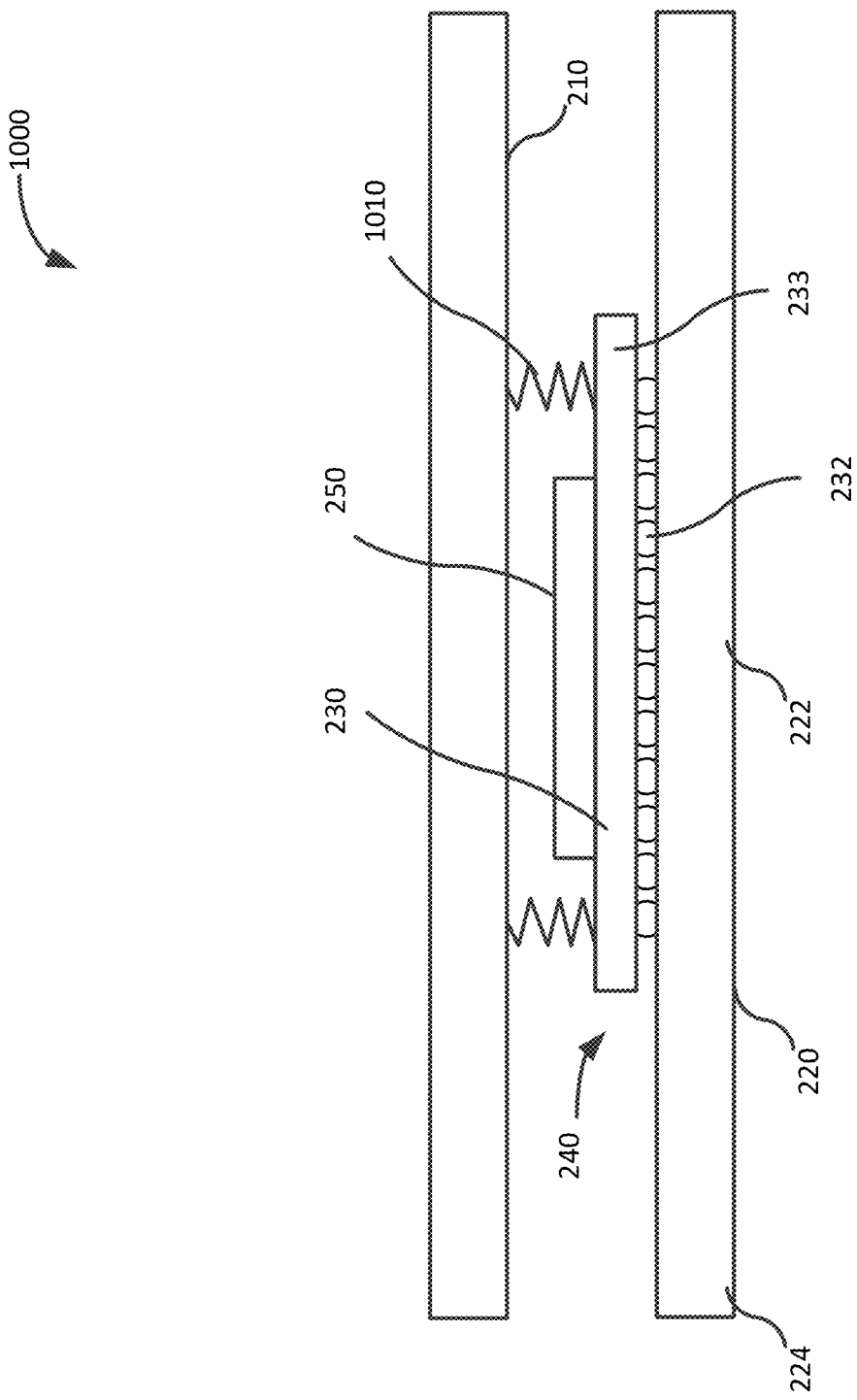

FIG. 10 illustrates a portion of an electronic device that includes compressible supports between a component and a housing portion according to embodiments of the present invention. Electronic device portion 1000 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230. Board 220 can be supported in electronic device 100 using rigid supports 260 (shown in FIG. 2) that can connect to housing portion 210 at a distance away from compressible supports 1010. One or more compressible supports 1010 can be between component 240 and housing portion 210. Compressible supports 1010 can be fixed to either or both component 240 and housing portion 210, for example using an adhesive, solder, fasteners, or other material or technique. In these and the other embodiments of the present invention, edge bonds 440 (shown in FIG. 4) formed of epoxy or other material can be placed at one or more edges 233 of substrate 230 to join substrate 230 to board 220.

Compressible supports 1010 are shown as springs in this example. This spring can be implemented using a Belleville washer, coned-disc spring, conical spring washer, disc spring, cupped spring washer, or other such apparatus. The springs used for compressible supports 1010 can be pre-compressed during assembly to provide a differential compression force 291 (shown in FIG. 2) pushing component 240 towards board 220. This differential compression force 291 can reduce a differential tensile force 290 (shown in FIG. 2) that can result during a drop event, thereby protecting electronic device 100.

Additionally, compressible supports 1010 can compress and expand when electronic device portion 1000 experiences a physical shock. Specifically, since region 224 of board 220 can move relative to housing portion 210 during a shock, the vertical displacement between region 222 and region 224 of board 220 can be reduced as compared to when fixed or rigid supports 260 (shown in FIG. 2) are used near region 224. This, along with edge bond 440 (shown in FIG. 4), when present, can reduce a differential tensile force at edges 233 of substrate 230 relative to board 220, thereby protecting solder-ball contacts 232 and other structures of electronic device portion 1000. In these examples, it should be noted that rigid supports 260 can be included and are relatively remote from component 240 such that region 224 of board 220 can move relative to housing portion 210 during a shock.

Figure 11:
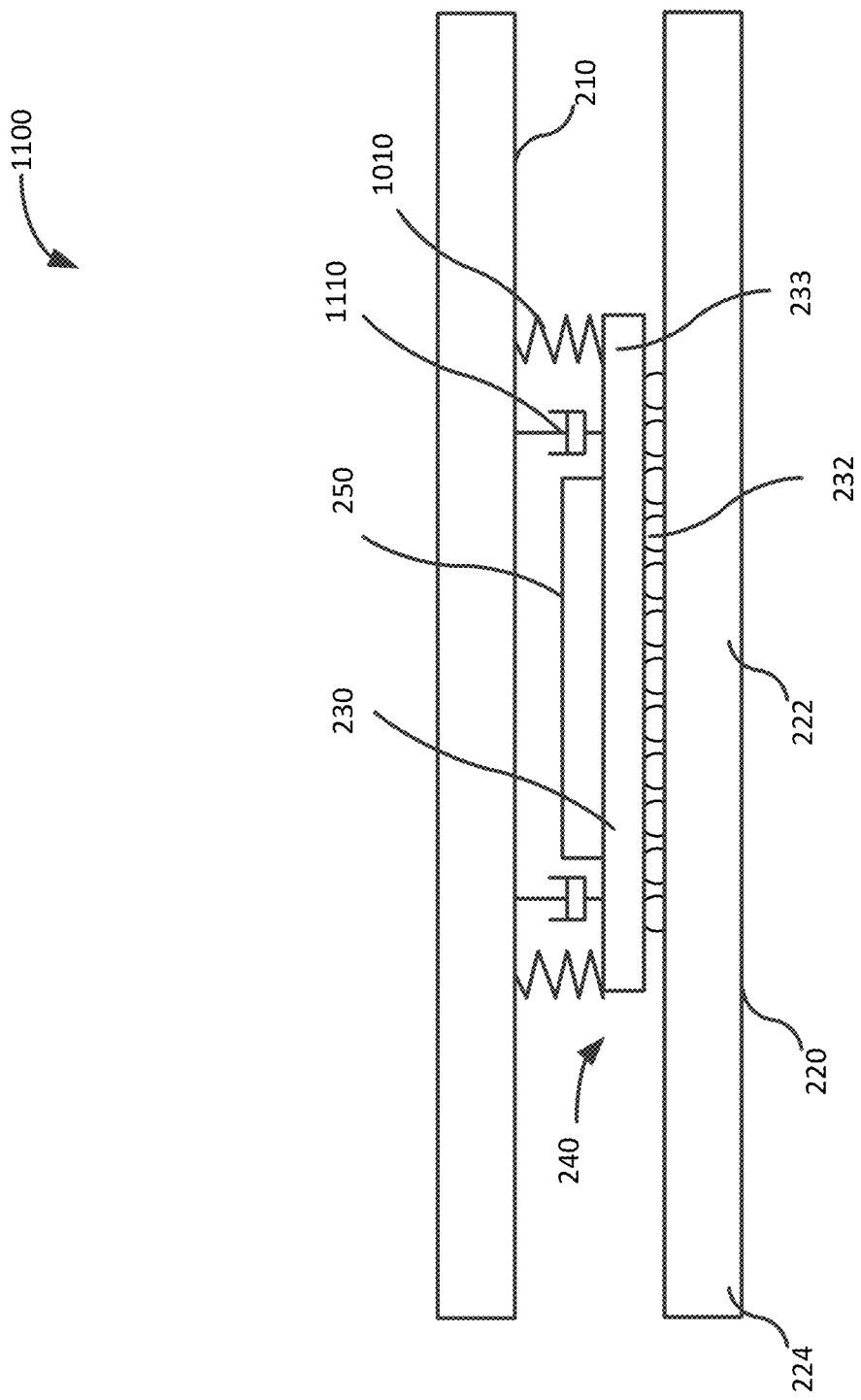

FIG. 11 illustrates a portion of an electronic device that includes compressible supports between a component and a housing portion according to embodiments of the present invention. Electronic device portion 1100 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230. Board 220 can be supported in electronic device 100 using rigid supports 260 (shown in FIG. 2) that can connect to housing portion 210 at a distance away from compressible supports 1010 and 1110. Compressible supports 1010 and 1110 can be between component 240 and housing portion 210. Compressible supports 1010 and 1110 can be fixed to either or both component 240 and housing portion 210, for example using an adhesive, solder, fasteners, or other material or technique. In these and other embodiments of the present invention, edge bonds 440 (shown in FIG. 4) formed of epoxy or other material can be placed at one or more edges 233 of substrate 230 to join substrate 230 to board 220.

Compressible supports 1010 are shown as springs in this example. This spring can be implemented using a Belleville washer, coned-disc spring, conical spring washer, disc spring, cupped spring washer, or other compressible structure. The springs used for compressible supports 1010 can be pre-compressed during assembly to provide a differential compression force 291 (shown in FIG. 2) pushing component 240 towards board 220. This differential compression force 291 can reduce a differential tensile force 290 (shown in FIG. 2) that can result during a drop event, thereby protecting electronic device 100. Compressible supports 1110 are shown as dashpots in this example. Compressible supports 1110 can be a damper, such as a linear damper or rotary damper, or other compressible structure. In this example, both a spring and a dashpot are shown, though in these and other embodiments of the present invention, either or both of these can be omitted, or one or more other compressible structures can be included.

Additionally, compressible supports 1010 and compressible supports 1110 can compress and expand when electronic device portion 1100 experiences a physical shock. Specifically, since region 224 of board 220 can move relative to housing portion 210 during a shock, the vertical displacement between region 222 and region 224 of board 220 can be reduced as compared to when fixed or rigid supports 260 (shown in FIG. 2) are used near region 224. This, along with edge bond 440, when present (shown in FIG. 4), can reduce a differential tensile force at edges 233 of substrate 230 relative to board 220, thereby protecting solder-ball contacts 232 and other structures of electronic device portion 1100. In these examples, it should be noted that rigid supports 260 can be included and are relatively remote from component 240 such that region 224 of board 220 can move relative to housing portion 210 during a shock.

These and other embodiments of the present invention can provide an electronic device having a component mounted to a board. The component can be physically coupled or otherwise connected back to the board through a compressible support. The compressible support can reduce a differential force between the component and the board. The compressible support can be positioned between the component and a loading structure attached to the board. Examples are shown in the following figures.

Figure 12:
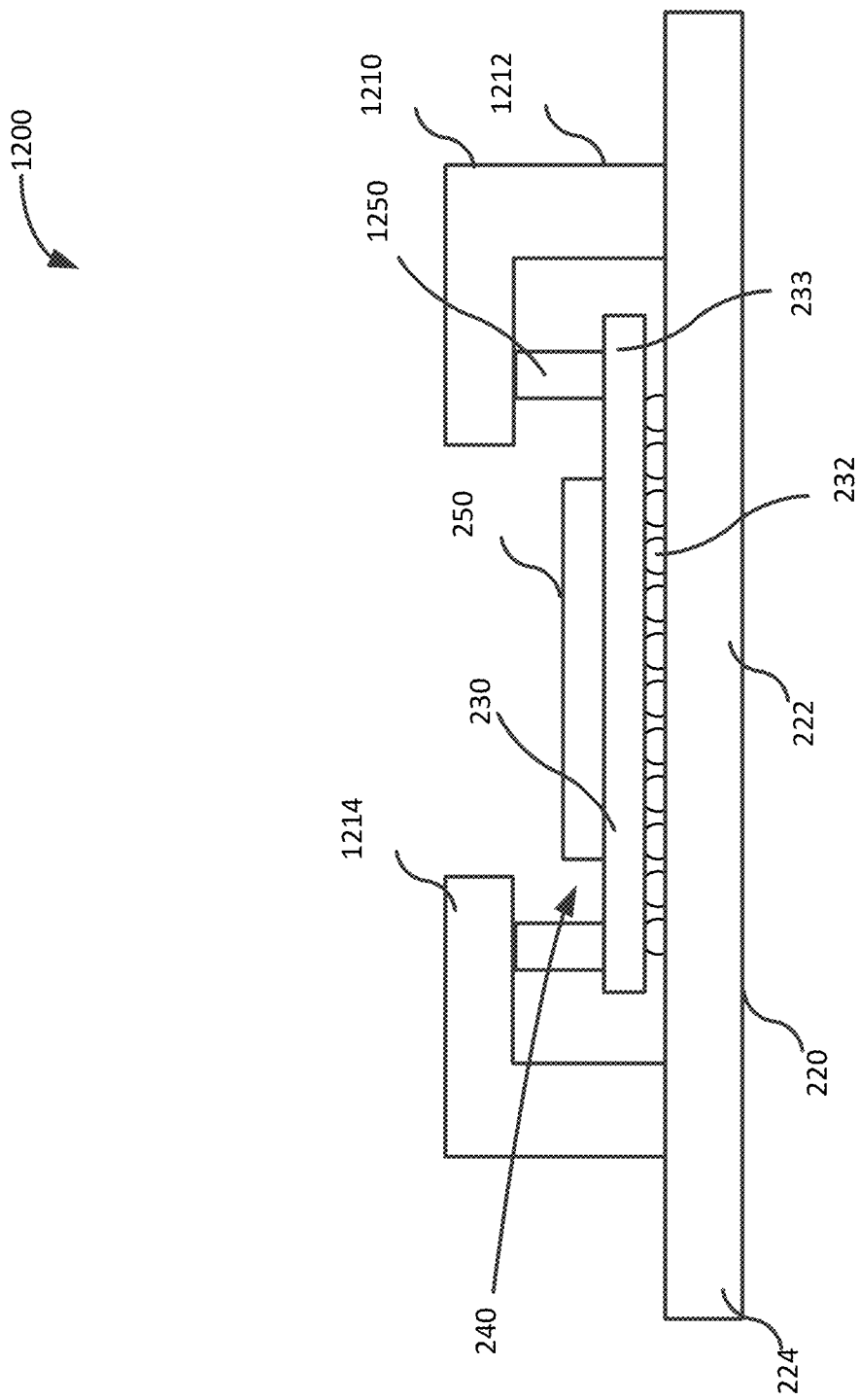
FIGS. 12-14 illustrate portions of electronic devices that include compressible supports between a component and a board according to embodiments of the present invention.

FIG. 12 illustrates a portion of an electronic device that includes one or more compressible supports between a component and a board according to an embodiment of the present invention. Electronic device portion 1200 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230.

One or more loading structures 1210 can be attached to a surface of board 220 for example using an adhesive, solder, fasteners, or other material or technique. Loading structures 1210 can include pier 1212 extending vertically from board 220 and beam 1214 that can extend laterally over a portion of component 240. Compressible supports 1250 can be between component 240 and beam 1214 of loading structure 1210. Compressible supports 1250 can be fixed to either or both component 240 and beam 1214, for example using an adhesive, solder, fasteners, or other material or technique. In these and other embodiments of the present invention, edge bonds 440 (shown in FIG. 4) formed of epoxy or other material can be placed at one or more edges 233 of substrate 230 to join substrate 230 to board 220.

Compressible supports 1250 can be the same as or similar to compressible supports 350 above. Compressible supports 1250 can be pliant, compliant, pliable, flexible, or otherwise able to compress or change shape under force. Compressible supports 1250 can be formed of foam, such as open-cell foam, semi-open-cell foam, semi-closed-cell foam, closed-cell foam, or other types of foam. Compressible supports 1250 can be formed of polyurethane, silicone, rubber, polycarbonate, or other polymer or elastomer. Compressible supports 1250 can be pre-compressed to improve their ability to cancel damaging tensile forces. For example, compressible supports 1250 can be formed of a compressed foam or elastomer. Compressible supports 1250 can be formed of conductive foam for electrical shielding.

Compressible supports 1250 can absorb, dampen, and dissipate energy from a shock event, such as a drop. Compressible supports 1250 can flex, compress, and expand to allow movement of regions of board 220 to reduce the stress on solder-ball contacts 232. In these and other embodiments of the present invention, compressible supports 1250 can be formed of a low-density foam having a high strain-rate sensitivity. Compressible supports 1250 can be pre-compressed during assembly to provide a differential compression force 291 (shown in FIG. 2) pushing substrate 230 towards board 220. While the presence of a differential compression force 291 is unlikely to damage solder-ball contacts 232 under normal conditions, a differential compression force 291 could damage or distort housing portion 210 or other portion of electronic device 100 (shown in FIG. 1.) Using a foam or other material having a high strain-rate sensitivity can allow compressible supports 950 to provide a low differential compression force 291 under normal or static conditions and a higher differential compression force 291 under a shock event. The lower differential compression force under normal conditions can prevent damage or distortion to housing portion 210. The higher differential compression force 291 during a shock event can cancel a higher differential tensile force 290 (shown in FIG. 2), which can help to protect electronic device 100.

When compressible supports 1250 are formed of foam or similar material, they can have various profiles when seen from a top view as drawn. That is, compressible supports 1250, and the other compressible supports shown here, can have various footprints where contact with substrate 230 or beam 1214 is made. For example, compressible supports can have a square footprint, a rectangular footprint, a circular footprint, an "L" shaped footprint, a "U" shaped footprint, or other footprint. In these and other embodiments of the present invention, one, two, three, four, or more than four compressible supports 1250 can be included. For example, a single compressible support 1250 can encircle chip 250. The single compressible support can have a rectangular, circular, or other shaped footprint, with an opening for chip 250.

In this and the other examples, one or more compressible supports 1250 can be formed using a spring or other compressible structure, where the spring can be implemented using a Belleville washer, coned-disc spring, conical spring washer, disc spring, cupped spring washer, or other such apparatus. Compressible support 1250 can be a dashpot or other damper, such as a linear damper or rotary damper. Compressible supports 1250 can be formed using a combination of one or more of these components. Compressible supports 1250 can be formed using one or more of these and one or more other pliant, compliant, pliable, flexible, or otherwise compressible structures.

Compressible supports 1250 can compress and expand when electronic device portion 1200 experiences a physical shock. This can help to reduce any vertical displacement between region 222 and region 224 of board 220 during a shock event. Also, the optional addition of edge bond 440 can help to fix edges 233 of substrate 230 in place relative to board 220. This combination of compressibility of compressible supports 1250, along with edge bond 440 (when present), can reduce a differential force at edges 233 of substrate 230 relative to board 220, thereby protecting solder-ball contacts 232 and other structures of electronic device portion 1200.

Figure 13:
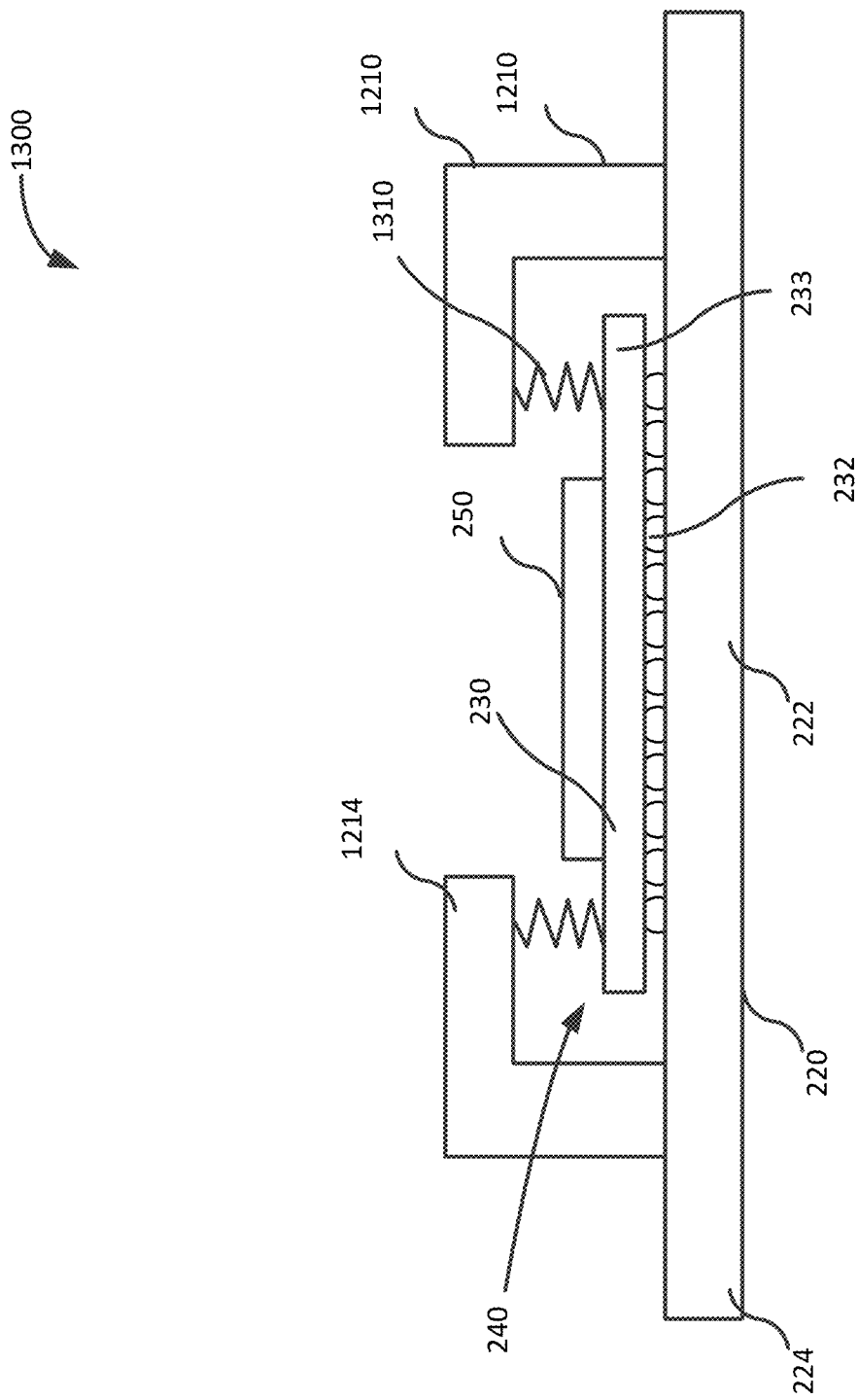

FIG. 13 illustrates a portion of an electronic device that includes one or more compressible supports between a component and a board according to an embodiment of the present invention. Electronic device portion 1300 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230.

One or more loading structures 1210 can be attached to a surface of board 220, for example using an adhesive, solder, fasteners, or other material or technique. Loading structures 1210 can include pier 1212 extending vertically from board 220 and beam 1214 that can extend laterally over a portion of component 240. Compressible supports 1310 can be between component 240 and beam 1214 of loading structure 1210. Compressible supports 1310 can be fixed to either or both component 240 and beam 1214, for example using an adhesive, solder, fasteners, or other material or technique. In these and other embodiments of the present invention, edge bonds 440 (shown in FIG. 4) formed of epoxy or other material can be placed at one or more edges 233 of substrate 230 to join substrate 230 to board 220.

Compressible supports 1310 are shown as springs in this example. This spring can be implemented using a Belleville washer, coned-disc spring, conical spring washer, disc spring, cupped spring washer, or other such apparatus. The springs used for compressible supports 1310 can be pre-compressed during assembly to provide a differential compression force 291 (shown in FIG. 2) pushing component 240 towards board 220. This differential compression force 291 can reduce a differential tensile force 290 (shown in FIG. 2) that can result during a drop event, thereby protecting electronic device 100.

Additionally, compressible supports 1310 can compress and expand when electronic device portion 1300 experiences a physical shock. Specifically, since region 224 of board 220 can move relative to housing portion 210 during a shock, the vertical displacement between region 222 and region 224 of board 220 can be reduced as compared to when fixed or rigid supports 260 (shown in FIG. 2) are used near region 224. This, along with edge bond 440, when present (shown in FIG. 4), can reduce a differential tensile force at edges 233 of substrate 230 relative to board 220, thereby protecting solder-ball contacts 232 and other structures of electronic device portion 1300. In these examples, it should be noted that rigid supports 260 can be included and can be relatively remote from component 240 such that region 224 of board 220 can move relative to housing portion 210 during a shock.

Figure 14:
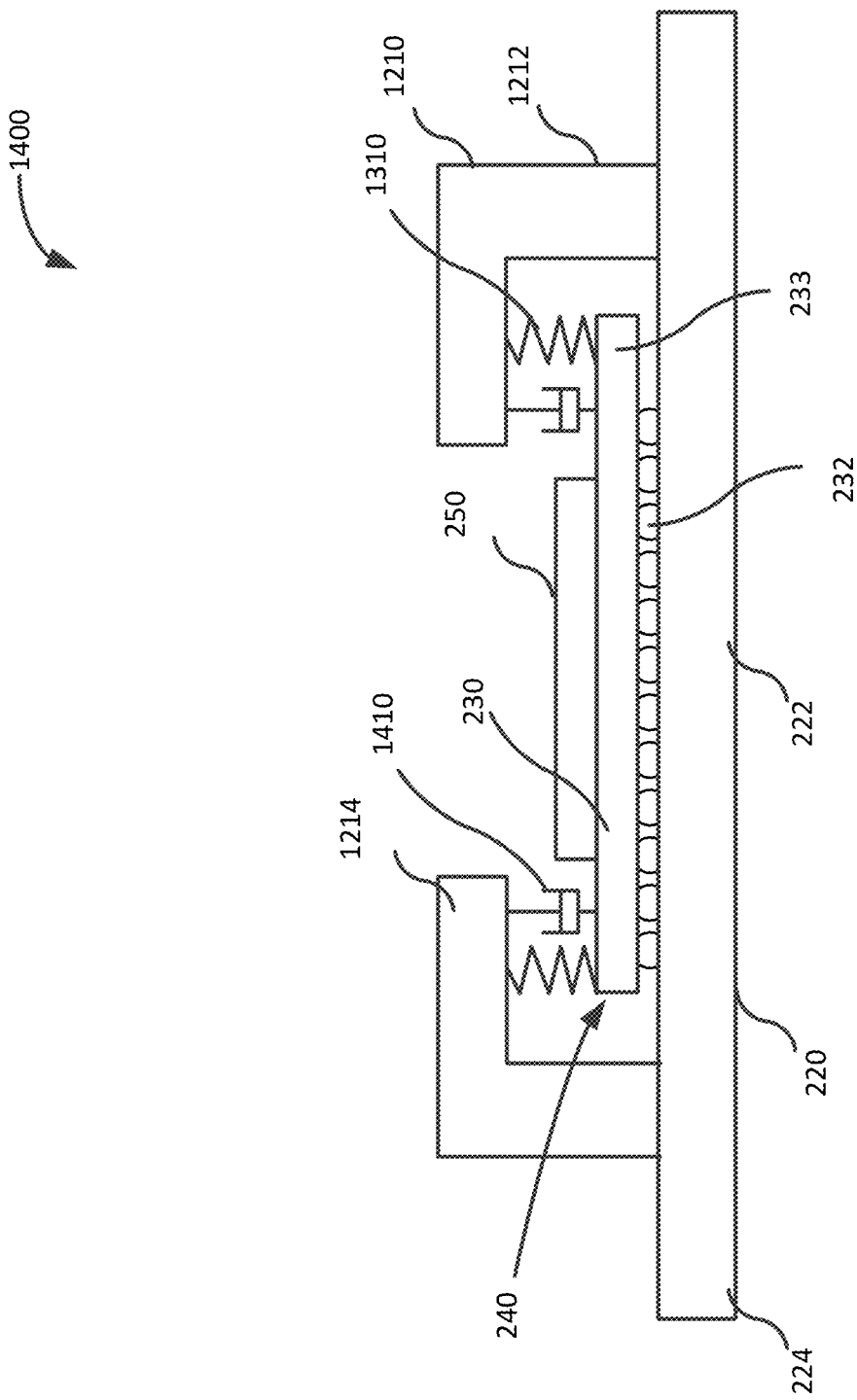

FIG. 14 illustrates a portion of an electronic device that includes one or more compressible supports between a component and a board according to an embodiment of the present invention. Electronic device portion 1400 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230.

One or more loading structures 1210 can be attached to a surface of board 220, for example using an adhesive, solder, fasteners, or other material or technique. Loading structures 1210 can include pier 1212 extending vertically from board 220 and beam 1214 that can extend laterally over a portion of component 240. Compressible supports 1310 and 1410 can be between component 240 and beam 1214 of loading structure 1210. Compressible supports 1310 and 1410 can be fixed to either or both component 240 and beam 1214, for example using an adhesive, solder, fasteners, or other material or technique. In these and other embodiments of the present invention, edge bonds 440 (shown in FIG. 4) formed of epoxy or other material can be placed at one or more edges 233 of substrate 230 to join substrate 230 to board 220.

Compressible supports 1310 are shown as springs in this example. This spring can be implemented using a Belleville washer, coned-disc spring, conical spring washer, disc spring, cupped spring washer, or other compressible structure. The springs used for compressible supports 1310 can be pre-compressed during assembly to provide a differential compression force 291 (shown in FIG. 2) pushing component 240 towards board 220. This differential compression force 291 can reduce a differential tensile force 290 (shown in FIG. 2) that can result during a drop event, thereby protecting electronic device 100. Compressible supports 1410 are shown as dashpots in this example. Compressible supports 1410 can be a dashpot or other damper, such as a linear damper or rotary damper, or other compressible structure. In this example, both a spring and a dashpot are shown, though in these and other embodiments of the present invention, either or both of these can be omitted, or one or more other compressible structures can be included.

Additionally, compressible supports 1310 and 1410 can compress and expand when electronic device portion 1400 experiences a physical shock. Specifically, since region 224 of board 220 can move relative to housing portion 210 during a shock, the vertical displacement between region 222 and region 224 of board 220 can be reduced as compared to when fixed or rigid supports 260 (shown in FIG. 2) are used near region 224. This, along with edge bond 440, when present (shown in FIG. 4), can reduce a differential tensile force at edges 233 of substrate 230 relative to board 220, thereby protecting solder-ball contacts 232 and other structures of electronic device portion 1400. In these examples, it should be noted that rigid supports 260 can be included and are relatively remote from component 240 such that region 224 of board 220 can move relative to housing portion 210 during a shock.

These and other embodiments of the present invention can provide an electronic device having a component mounted to a board. The component can be fixed or secured to the board through a securing structure. The securing structure can reduce a differential force between the component and the board. That is, a force received by the component is translated to the board, and forces received by the board are translated to the component. In this way, forces received by the board or component appear as common-mode forces, which are typically not damaging. Examples are shown in the following figures.

Figure 15:
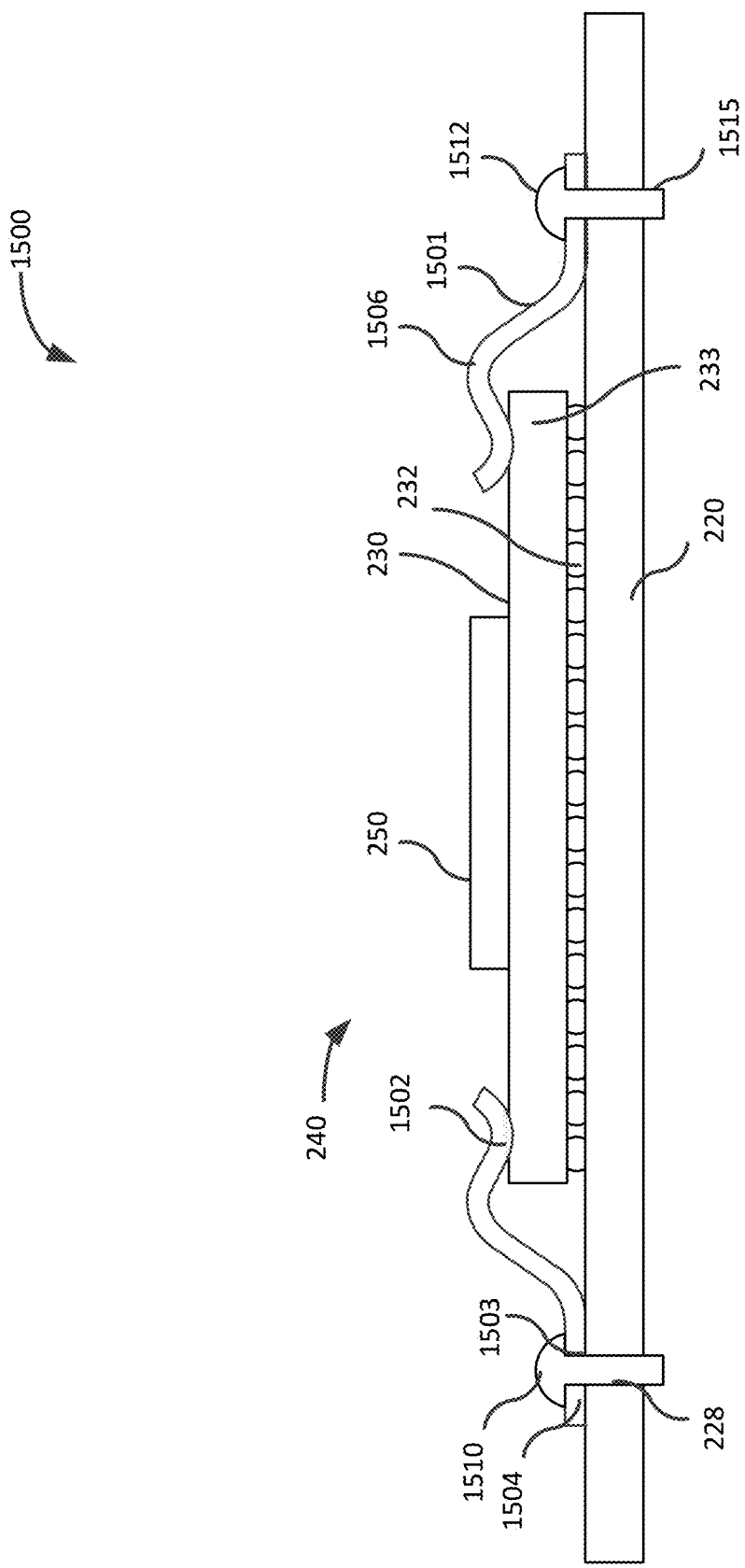
FIGS. 15-17C illustrate portions of electronic devices that include securing structures between a component and a board according to embodiments of the present invention.

FIG. 15 illustrates a portion of an electronic device that includes one or more securing structures between a component and a board according to an embodiment of the present invention. Electronic device portion 1500 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230.

One or more securing structures 1501 can be attached to a surface of board 220, for example using an adhesive, solder, fasteners, or other material or technique. Securing structures 1501 can be attached to board 220 by fastener 1510. Fastener 1510 can include head 1512 and body 1515, which can be threaded into a nut (not shown.) Body 1515 can instead be inserted into opening 1503 in end 1504 of securing structure 1501 and press-fit into opening 228 in board 220. In these and other embodiments of the present invention, edge bonds 440 (shown in FIG. 4) formed of epoxy or other material can be placed at one or more edges 233 of substrate 230 to join substrate 230 to board 220.

Securing structures 1501 can hold component 240 in place against board 220 when electronic device portion 1500 experiences a physical shock. This can help to reduce any differential tensile force between component 240 and board 220 during a shock event. That is, a force received by component 240 is translated to board 220, and forces received by board 220 are translated to component 240. In this way, forces received by board 220 or component 240 appear as common-mode forces, which are typically not damaging. Also, the optional addition of edge bond 440 can help to fix edges 233 of substrate 230 in place relative to board 220. This combination of securing structures 1501, along with edge bond 440 (when present), can reduce a differential force at edges 233 of substrate 230 relative to board 220, thereby protecting solder-ball contacts 232 and other structures of electronic device portion 1500.

Securing structures 1501 are shown here as spring fingers that can attach to board 220 and include bend 1506 that enables securing structure 1501 to apply a force at contact portion 1502 to component 240 in the direction of board 220. One or more securing structures 1501 can be used to secure component 240 to board 220. For example, securing structures 1501 can be positioned at each corner of component 240. Securing structures 1501 can include joining portions, such as joining portion 1732 (shown in FIG. 17B) or joining portion 1752 (shown in FIG. 17C) that can join two or more spring fingers or securing structures 1501 into a single securing structure. The securing structures 1501 can be formed of a nonconductive material. The securing structures 1501 can be formed of a conductive material. The securing structures 1501 can also serve to help dissipate heat.

Figure 16:
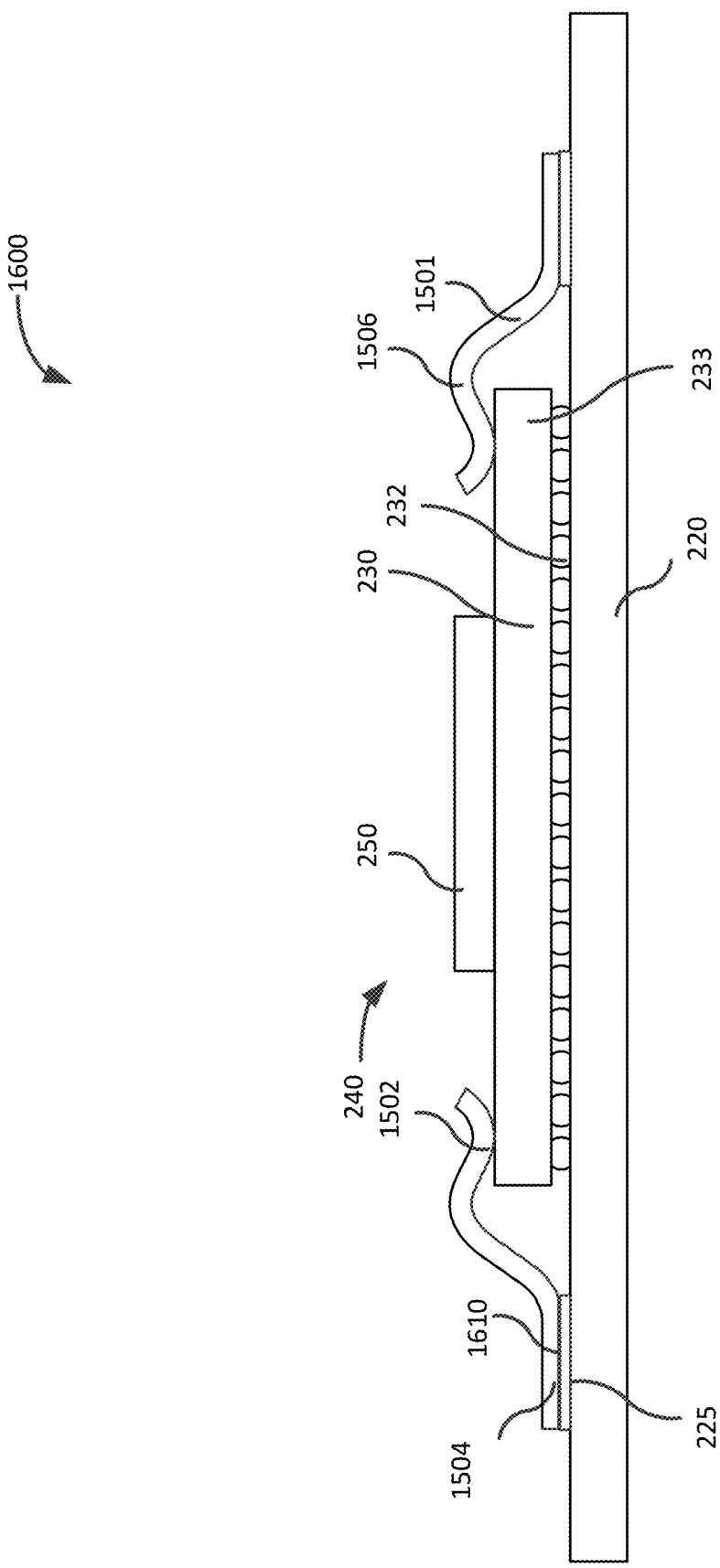

FIG. 16 illustrates a portion of an electronic device that includes one or more securing structures between a component and a board according to an embodiment of the present invention. Electronic device portion 1600 can include board 220 supporting component 240. Component 240 can include substrate 230 and chip 250. Substrate 230 can include traces and interconnect (not shown) that form electrical pathways for chip 250. Traces and interconnect on substrate 230 can terminate in solder-ball contacts 232, which can form electrical pathways between traces and interconnect (not shown) on board 220 and traces and interconnect on substrate 230.

One or more securing structures 1501 can be attached to a surface of board 220, for example using adhesives, fasteners, solder, or other material or technique. In this example, securing structures 1501 can be attached to location 225 on board 220 using solder 1610. That is, end 1504 of securing structure 1501 can be attached to board 220 using solder 1610. In these and other embodiments of the present invention, edge bonds 440 (shown in FIG. 4) formed of epoxy or other material can be placed at one or more edges 233 of substrate 230 to join substrate 230 to board 220.

Securing structures 1501 can hold component 240 in place against board 220 when electronic device portion 1600 experiences a physical shock. This can help to reduce any differential force between component 240 and board 220 during a shock event. Also, the optional addition of edge bond 440 can help to fix edges 233 of substrate 230 in place relative to board 220. This combination of securing structures 1501, along with edge bond 440 (when present), can reduce a differential force at edges 233 of substrate 230 relative to board 220, thereby protecting solder-ball contacts 232 and other structures of electronic device portion 1600.

Securing structures 1501 are shown here as spring fingers that can attach to board 220 and include bend 1506 that enables securing structure 1501 to apply a force at contact portion 1502 to component 240 in the direction of board 220. One or more securing structures 1501 can be used to secure component 240 to board 220. For example, securing structures 1501 can be positioned at each corner of component 240. Securing structures 1501 can include joining portions, such as joining portion 1732 (shown in FIG. 17B) or joining portion 1752 (shown in FIG. 17C) that can join two or more spring fingers or securing structures 1501 into a single securing structure. The securing structures 1501 can be formed of a nonconductive material. The securing structures 1501 can be formed of a conductive material. The securing structures 1501 can also serve to help dissipate heat.

Figure 17C:
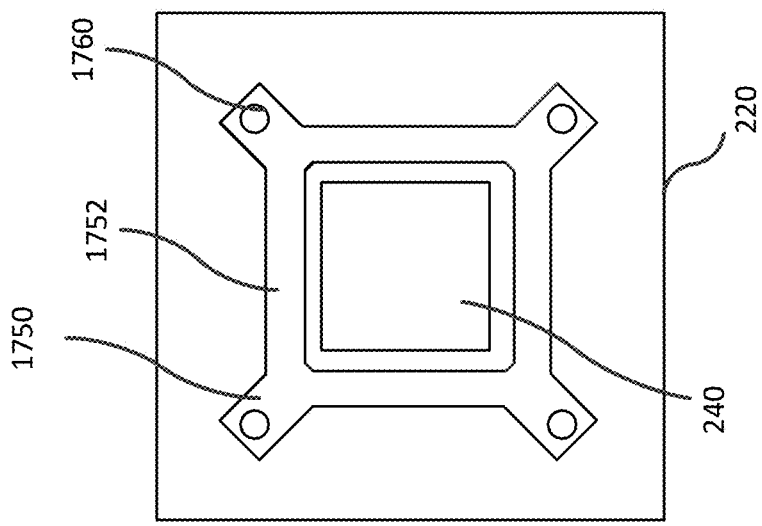
Figure 17B:
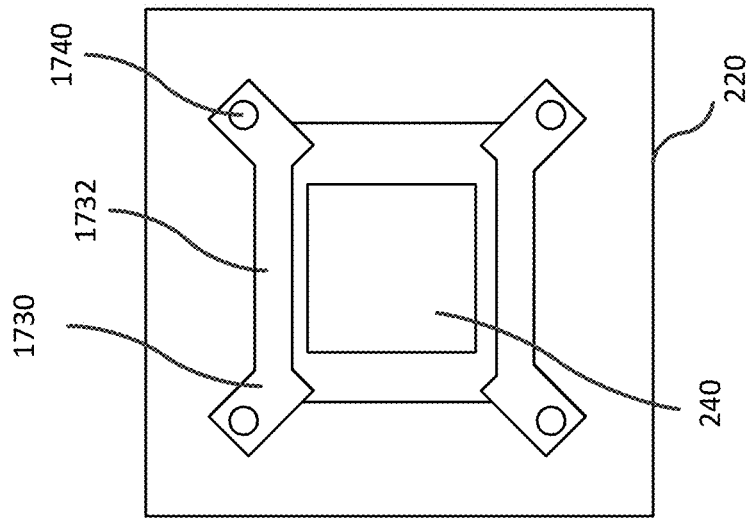
Figure 17A:
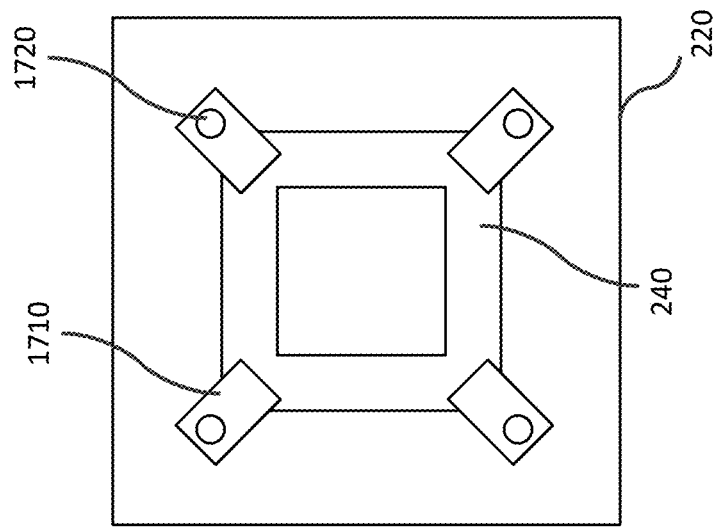

FIGS. 17A through 17C illustrate portions of electronic devices that include one or more securing structures between a component and a board according to an embodiment of the present invention. In FIG. 17A, component 240 can be held in place relative to board 220 using securing structures 1710. Securing structures 1710 can be attached to board 220 using fasteners 1720. Securing structures 1710 can be spring fingers and can be the same or similar to securing structures 1501 (shown in FIG. 15.) Fasteners 1720 can be the same or similar to fasteners 1510 (shown in FIG. 15.) Securing structures 1710 can be located at each corner of component 240.

In FIG. 17B, component 240 can be held in place relative to board 220 using securing structures 1730. Securing structures 1730 can be attached to board 220 using fasteners 1740. Securing structures 1730 can be spring fingers and can be the same or similar to securing structures 1501 (shown in FIG. 15) and can further include joining portion 1732. Fasteners 1740 can be the same or similar to fasteners 1510 (shown in FIG. 15.) Securing structures 1730 can be located at each corner of component 240 and joining portions 1732 can join two or more of the securing structures 1730 together.

In FIG. 17C, component 240 can be held in place relative to board 220 using securing structures 1750. Securing structures 1750 can be attached to board 220 using fasteners 1760. Securing structures 1750 can be spring fingers and can be the same or similar to securing structures 1501 (shown in FIG. 15) and can further include joining portion 1752. Fasteners 1760 can be the same or similar to fasteners 1510 (shown in FIG. 15.) Securing structures 1750 can be located at each corner of component 240 and joining portion 1752 can join the four securing structures 1730 together. Instead of fasteners 1760, the examples of FIG. 17A, FIG. 17B, and FIG. 17C can use solder 1610 or other device or material.

When made from foam or other material, the compressible supports in the above examples can have various cross-sections. That is, the compressible supports can have various footprints where contact with a component, board, or housing portion is made. For example, the compressible supports can have a square footprint, a rectangular footprint, a circular footprint, an "L" shaped footprint, a "U" shaped footprint, or other footprint. In these and other embodiments of the present invention, one, two, three, four, or more than four compressible supports can be included. For example, a single compressible support can encircle a chip of a component. The single compressible support can have a rectangular, circular, or other shaped footprint, with an opening for the chip. Examples are shown in the following figures.

Figure 18B:
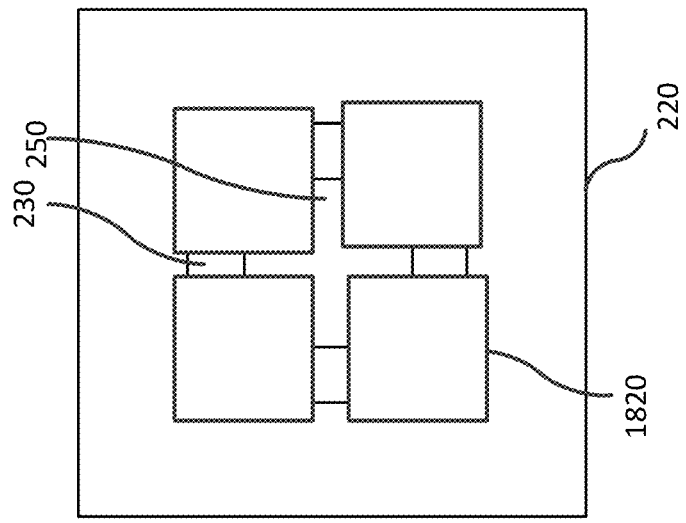
FIGS. 18A and 18B illustrate footprints for compressible supports according to embodiments of the present invention.
Figure 18A:
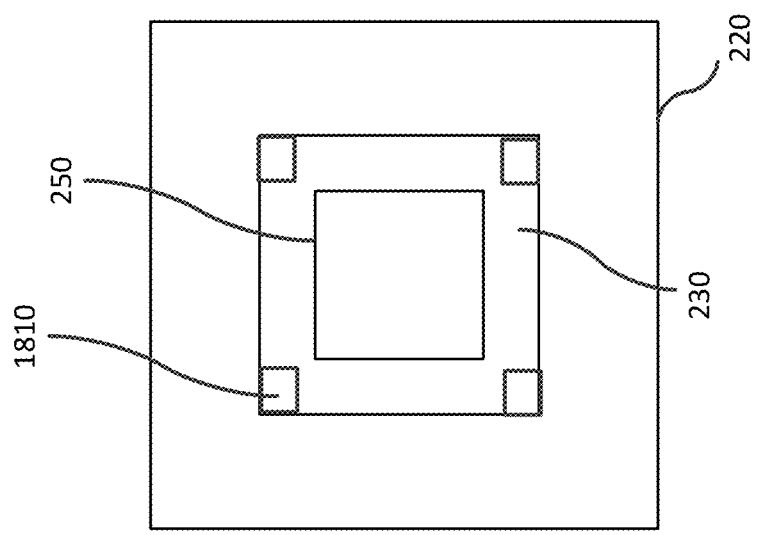

FIGS. 18A and 18B illustrate footprints for compressible supports according to embodiments of the present invention. In FIG. 18A, a compressible support 1810 can be placed in each corner of substrate 230. Each of the four compressible supports can be spaced from chip 250 or can be laterally adjacent to chip 250. Substrate 230 can be attached to board 220. In FIG. 18B, each of four compressible supports 1820 can be placed in a corner of substrate 230 and can partially encircle and overlap chip 250. Substrate 230 can be attached to board 220. Compressible supports 1810 and compressible supports 1820 can be the same or similar to, and can be used in assembly in a same or similar manner, as compressible supports 350 (shown in FIG. 3), compressible supports 560 (shown in FIG. 5), compressible supports 950 (shown in FIG. 9), and compressible supports 1250 (shown in FIG. 12.)

In various embodiments of the present invention, the housings, housing portions, enclosures, loading structures, pillars, spring fingers, and other nonconductive portions can be formed using insert, injection, overmolding, or other molding, 3-D printing, machining, or other manufacturing process. They can be formed of silicon or silicone, rubber, hard rubber, plastic, nylon, glass-filled nylon, liquid-crystal polymers, or other nonconductive material or combination of materials. The printed circuit board or other appropriate substrates used can be formed of FR-4, BT or other material. Printed circuit boards can be replaced by other substrates, such as flexible circuit boards, in many embodiments of the present invention, while flexible circuit boards can be replaced by printed circuit boards in these and other embodiments of the present invention.

These and other embodiments of the present invention can provide structures, methods, and apparatus that can be located in various types of devices, such as portable computing devices, tablet computers, desktop computers, laptops, all-in-one computers, wearable computing devices, smart phones, storage devices, portable media players, navigation systems, headphones, earbuds, speakers, or other audio components, monitors, power supplies, adapters, remote control devices, chargers, and other devices.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An electronic device comprising: a board; a component attached to a first side of the board; an edge bond between a corner of the component and the first side of the board; a first housing portion; and a first compressible support between the component and the first housing portion.

2. The electronic device of claim 1 wherein the board comprises a printed circuit board.

3. The electronic device of claim 2 wherein the component is attached to the board by a plurality of solder-ball contacts.

4. The electronic device of claim 3 wherein the first compressible support extends from the component to the first housing portion.

5. The electronic device of claim 4 wherein the first compressible support comprises foam.

6. The electronic device of claim 5 wherein the first compressible support is attached to the component using an adhesive.

7. The electronic device of claim 3 wherein the first compressible support comprises a spring.

8. The electronic device of claim 3 further comprising a second compressible support between a second side of the board and a second housing.

9. The electronic device of claim 3 wherein the first housing portion comprises a portion of enclosure that at least partially houses the electronic device.

10. The electronic device of claim 3 wherein the first compressible support extends from the component to a pillar formed as part of the first housing portion.

11. The electronic device of claim 10 wherein the first compressible support comprises foam.

12. The electronic device of claim 10 wherein the first compressible support comprises a spring.

13. An electronic device comprising: a board; a component attached to a first side of the board, wherein the component comprises an integrated circuit and a substrate; a loading structure attached to the first side of the board and having a beam portion extending over an edge of the component; and a compressible support in contact with the substrate of the component and extending to the beam portion of the loading structure.

14. The electronic device of claim 13 wherein the board comprises a printed circuit board and the component is attached to the board by a plurality of solder-ball contacts.

15. The electronic device of claim 14 further comprising an edge bond between a corner of the component and the board.

16. The electronic device of claim 15 wherein the compressible support comprises foam.

17. The electronic device of claim 15 wherein the compressible support comprises a spring.

18. The electronic device of claim 15 wherein the compressible support comprises a dashpot.

19. An electronic device comprising: a board; a component attached to a first side of the board; an edge bond between a corner of the component and the first side of the board; and a securing structure to secure the component to the board, wherein the securing structure comprises a spring finger having a first end attached to the board and including a bend, such that a second end of the spring finger contacts the component and provides a force to the component in the direction of the board.

20. The electronic device of claim 19 wherein the component comprises an integrated circuit and a substrate, and the second end of the spring finger contacts the substrate of the component.

* * * * *